(12) United States Patent
Vooka et al.

(10) Patent No.: US 9,836,373 B2
(45) Date of Patent: Dec. 5, 2017

(54) ON-CHIP FIELD TESTING METHODS AND APPARATUS

(71) Applicant: Texas Instruments Incorporated, Dallas, TX (US)

(72) Inventors: Srinivas Kumar Vooka, Kaggadasapura (IN); Vishwanath S, Bangalore (IN); Pranav Murthy, Bangalore (IN); Ratheesh Thekke Veetil, Bangalore (IN); Rahul Gulati, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 65 days.

(21) Appl. No.: 14/630,149

(22) Filed: Feb. 24, 2015

(65) Prior Publication Data

US 2016/0146888 A1    May 26, 2016

(30) Foreign Application Priority Data

Nov. 26, 2014    (IN) .............................. 5913/CHE/2014

(51) Int. Cl.
| | |
|---|---|
| G06F 11/27 | (2006.01) |
| G01R 31/3187 | (2006.01) |
| G06F 11/22 | (2006.01) |
| G01R 31/319 | (2006.01) |

(52) U.S. Cl.
CPC .......... *G06F 11/27* (2013.01); *G01R 31/3187* (2013.01); *G06F 11/2284* (2013.01); *G01R 31/31908* (2013.01)

(58) Field of Classification Search
CPC .......................... G01R 31/3177; G06F 11/27
See application file for complete search history.

(56) References Cited

U.S. PATENT DOCUMENTS

| | | | | |
|---|---|---|---|---|
| 6,581,019 B1 * | 6/2003 | Bapst | ............. | G01R 31/318502 702/117 |
| 7,426,668 B2 * | 9/2008 | Mukherjee | ....... | G01R 31/31724 365/201 |

(Continued)

OTHER PUBLICATIONS

"System-on-Chip Test Architectures, Nanometer Design for Testability, A volume in Systems on Silicon", Edited by: Wang et al (Chapter 2—Digital Test Architectures; Wang), ISBN: 978-0-12-373973-5, Copyright © 2008 Elsevier Inc.*

(Continued)

*Primary Examiner* — Cynthia Britt
*Assistant Examiner* — Rong Tang
(74) *Attorney, Agent, or Firm* — Ronald O. Neerings; Charles A. Brill; Frank D. Cimino

(57) ABSTRACT

On-chip field testing methods and apparatus are disclosed. Example on-chip testers disclosed herein include a decoder having a test data input and a test stimuli interface. Disclosed example on-chip testers also include a multiplexer having a first multiplexer interface coupled to the test stimuli interface, a second multiplexer interface coupled to an automatic test equipment interface, a third multiplexer interface coupled to a design-for-testing subsystem interface and an interface selection input. Disclosed example on-chip testers further include a memory having a memory interface coupled to the test data input.

20 Claims, 14 Drawing Sheets

(56) References Cited

U.S. PATENT DOCUMENTS 8,583,973 B1 * 11/2013 Chakravarty ...... G01R 31/3187
714/727
2012/0072790 A1 * 3/2012 Burggraf, III ......... G11C 29/00
714/718

OTHER PUBLICATIONS

"System-on-Chip Test Architectures, Nanometer Design for Testability, A volume in Systems on Silicon", Edited by: Wang et al (Chapter 4—System/Network-On-Chip Test Architectures, Liu et al.,), ISBN: 978-0-12-373973-5, Copyright © 2008 Elsevier Inc.*
Texas Instruments, "TDA3x SoC Processors for Advanced Driver Assist Systems (ASAS) Technical Brief", from file dated Oct. 17, 2014 (6 pages).
Texas Instruments, "New TDA3x SoC for ADAS solutions in entry-to mid-level automobiles", from file dated Oct. 22, 2014 (4 pages).

* cited by examiner

ON-CHIP FIELD TESTING METHODS AND APPARATUS

RELATED APPLICATION(S)

This patent claims priority to Indian Provisional Patent Application Serial No. 5913/CHE/2014, which is titled "TESTER ON CHIP: AN INNOVATIVE SOLUTION FOR COMPREHENSIVE FIELD TEST," and which was filed on Nov. 26, 2014. Indian Provisional Patent Application Serial No. 5913/CHE/2014 is incorporated herein by reference in its entirety.

FIELD OF THE DISCLOSURE

This disclosure relates generally to integrated circuit testing and, more particularly, to on-chip field testing methods and apparatus.

BACKGROUND

Integrated circuits, such as system-on-chip (SoC) devices, are used to implement an advanced driver assist system (ADAS) in road vehicles. ADAS features are intended to automate and/or enhance operation of the vehicle, improve vehicle safety, etc. For example, SoC devices are used to implement ADAS features such as front camera analytics (FCA), rear-camera analytics (RCA), auto-radar applications, etc. Such ADAS features may be subject to safety requirements, such as a particular Automotive Safety Integrity Level (ASIL) specified by the ISO (International Organization for Standardization) 26262 Functional Safety for Road Vehicles standard.

During manufacturing, structural tests can be performed on an SoC device to check for errors, defects, failures, etc., in the physical structure of the device. Such structural testing of prior SoC devices has been performed using external automated test equipment (ATE) coupled to an ATE interface of the SoC device.

SUMMARY

The methods and apparatus disclosed herein relate generally to integrated circuit testing and, more particularly, to on-chip field testing methods and apparatus. Some example on-chip testers disclosed herein include a decoder module (also referred to herein as a decoder) having a test data input and a test stimuli interface. Example on-chip testers disclosed herein also include a multiplexer module (also referred to herein as a multiplexer) having a first multiplexer interface coupled to the test stimuli interface, a second multiplexer interface coupled to an automatic test equipment interface, a third multiplexer interface coupled to a design-for-testing subsystem interface and an interface selection input. Example on-chip testers disclosed herein further include a memory module (also referred to herein as a memory) having a memory interface coupled to the test data input.

In some example on-chip testers disclosed herein, the decoder module further has a control input. Some such example on-chip testers include a configuration register having a register input and a register output, with the register output being coupled to the control input. Some such example on-chip testers also include an interconnect interface having an input interface coupled to a system-on-chip interconnect and an output interface coupled to the register input.

Some example on-chip testers disclosed herein include a configuration register having a register input and a register output, with the register output being coupled to the interface selection input. Some such disclosed example on-chip testers also include an interconnect interface having an input interface coupled to a system-on-chip interconnect and an output interface coupled to the register input. Alternatively, in some such example on-chip testers, the register input is coupled to a memory interface, and the configuration register is a memory mapped register.

In some example on-chip testers disclosed herein, the multiplexer module is a first multiplexer module, the interface selection input is a first interface selection input, the memory module is a first memory module, and the memory interface is a first memory interface. In some examples, such on-chip testers include a second memory module having a second memory interface. Some such disclosed example on-chip testers also include a second multiplexer having a fourth multiplexer interface, a fifth multiplexer interface, a sixth multiplexer interface, and a second interface selection input, with the fourth multiplexer interface being coupled to the first memory interface, the fifth multiplexer interface being coupled to the second memory interface and the test data input being coupled to the sixth multiplexer interface. In some examples, such on-chip testers further include a configuration register having a register input and a register output, with the register output being coupled to the second interface selection input, and an interconnect interface having an input interface coupled to a system-on-chip interconnect and an output interface coupled to the register input.

Some example on-chip testers disclosed herein include a decoder module to decode stored test data to determine test stimuli to apply to a design-for-testing subsystems of an integrated circuit (e.g., such as an SoC device). Such disclosed example on-chip testers also include a multiplexer module responsive to a selection control input to select between at least one of coupling the decoder module to the design-for-testing one or more subsystems or coupling an automatic test equipment interface to the design-for-testing one or more subsystems.

Some such disclosed example on-chip testers further include a configuration register to control operation of the decoder module. Some such disclosed example on-chip testers also include an interconnect interface in communication with the configuration register and a system-on-chip interconnect of the integrated circuit to permit the configuration register to be programmed via the system-on-chip interconnect.

Some example on-chip testers disclosed herein further include a configuration register to control operation of the multiplexer. Some such disclosed example on-chip testers also include an interconnect interface in communication with the configuration register and a system-on-chip interconnect of the integrated circuit to permit the configuration register to be programmed via the system-on-chip interconnect.

Some example on-chip testers disclosed herein include a memory mapped register to control operation of the multiplexer.

In some example on-chip testers disclosed herein, the decoder included in the example on-chip tester is further to determine whether a type of first stored data corresponds to a control type or a data type. In some such examples, when the type of the first stored data corresponds to the control type, the decoder is to (i) decode an identifier included in the first stored data and (ii) determine the test stimuli based on the identifier and payload data included in the first stored data. However, when the type of the first stored data corresponds to the data type, the decoder is to determine the test stimuli based on the first stored data and contents of second stored data decoded prior to decoding of the first stored data.

In some example on-chip testers disclosed herein, the multiplexer module is a first multiplexer module. Furthermore, some such disclosed example on-chip testers include a second multiplexer to selectively couple the decoder to at least one of a first memory module or a second memory module storing the test data. Some such disclosed example on-chip testers also include an interconnect interface in communication with a system-on-chip interconnect of the integrated circuit and the first memory module to permit the stored test data to be downloaded to the first memory module from an external device via the system-on-chip interconnect.

In some example on-chip testers disclosed herein, the decoder module is to apply the test stimuli to the design-for-testing subsystem without connecting to automatic test equipment external to the integrated circuit.

Some example integrated circuits (e.g., SoC devices) disclosed herein include one or more example design-for-testing subsystems in communication with multiple logic modules. In some such examples, a design-for-testing subsystem is to apply test stimuli to respective ones of the logic modules and receive corresponding test results from the respective ones of the logic modules. Some such disclosed example integrated circuits also include an example on-chip tester to determine first test stimuli to apply to a first one of the logic modules. Some such disclosed example integrated circuits further include an example multiplexer to selectively couple the design-for-testing subsystem to at least one of the on-chip tester or an automatic test equipment interface.

In some disclosed example integrated circuits, the on-chip tester is to decode stored test data to determine the test stimuli. For example, the stored test data may include code words and data words.

Some disclosed example integrated circuits further include an example boot loader to determine whether a reset of a primary boot processor of the integrated circuit was initiated by the on-chip tester. In some such examples, the boot loader is to perform a first boot procedure (e.g., a normal boot procedure) when the reset of the primary boot processor was not initiated by the on-chip tester. In some such examples, the boot loader is to perform a second boot procedure (e.g., different from the first procedure, such as a warm-reset boot procedure) when the reset of the primary boot processor was initiated by the on-chip tester.

In some disclosed example integrated circuits, the primary boot processor implements a system-on-chip interconnect. In some such examples, the on-chip tester is controlled via the system-on-chip interconnect.

In some disclosed example integrated circuits, the on-chip tester is to decode stored test data to determine the test stimuli, and the stored test data is downloaded to the on-chip tester via the system-on-chip interconnect.

In some disclosed example integrated circuits, the on-chip tester is to apply the first test stimuli to the design-for-testing subsystem without connecting to automatic test equipment external to the integrated circuit.

Some example methods for on-chip field testing disclosed herein include configuring a multiplexer to connect an on-chip tester to a design-for-testing subsystem in communication with logic modules of an integrated circuit. Some such disclosed example methods also include triggering operation of the on-chip tester to apply test stimuli to the design-for-testing subsystem via the multiplexer. Some such disclosed example methods further include comparing results of applying the test stimuli with reference results to test a first one of the logic modules of the integrated circuit.

Some such disclosed example methods also include determining whether a reset of a primary boot processor of the integrated circuit was initiated by the on-chip tester. Some such disclosed example methods include performing a first boot procedure (e.g., a normal boor procedure) when the reset of the primary boot processor was not initiated by the on-chip tester. Some such disclosed example methods further include performing a second boot procedure (e.g., different from the first procedure, such as a warm-reset boot procedure) when the reset of the primary boot processor was initiated by the on-chip tester.

Some disclosed example methods also include programming a configuration register of the on-chip tester via a system-on-chip interconnect to trigger operation of the on-chip tester.

Some disclosed example methods also include programming a configuration register of the on-chip tester to select a first one of multiple memory modules from which the on-chip tester is to access test data to be decoded to determine the test stimuli. Some such disclosed example methods further include downloading the test data to the first one of the memory modules via a system-on-chip interconnect.

Some disclosed example methods also include applying the test stimuli to the design-for-testing subsystem without connecting to automatic test equipment external to the integrated circuit.

These and other example methods, apparatus, systems and articles of manufacture (e.g., physical storage media) to implement on-chip field testing are disclosed in greater detail below.

BRIEF DESCRIPTION OF THE DRAWINGS

FIGS. 3A-B collectively illustrate an example comparison of test stimuli before and after being represented using the example format of FIG. 2

Wherever possible, the same reference numbers will be used throughout the drawing(s) and accompanying written description to refer to the same or like parts, elements, etc.

DETAILED DESCRIPTION

Figure 1A:
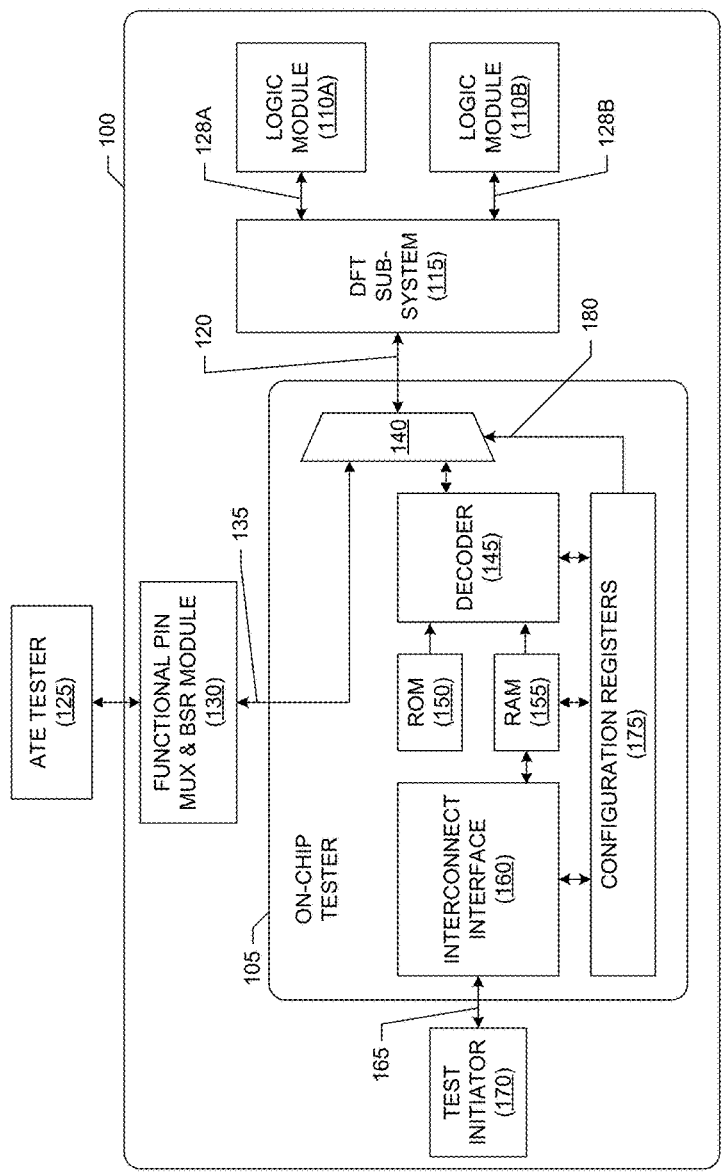
FIG. 1A is a block diagram of a first example SoC device including a first example on-chip tester implemented in accordance with the teachings of this disclosure.

ADAS features may be required to meet specified safety requirements. For an SoC device implementing an ADAS feature, the ability to run structural field tests on the SoC device in the context of an implemented (e.g., end-user) system can enable determination of whether the SoC device is operating properly and the overall safety requirements for the ADAS will be met. However, structural field testing of prior SoC devices (e.g., which checks for errors, defects, failures, etc., in the physical structure of the device) has been performed using external automated test equipment (ATE) coupled to an ATE interface of the SoC device. Because an external ATE device is required for such testing, ATE-based tests are not well-suited for use in an end-user system.

Thus, there is a need to provide a capability for running field tests on SoC devices at an end-user system level without the use of external test devices. Furthermore, such field tests should include any field test capable of being run using ATE, whether they are pre-defined tests or user-defined tests specified at run-time. The ability to support such structural field testing at an end-user system level may provide a competitive advantage in safety critical markets, such as the ADAS market.

On-chip field testing methods and apparatus disclosed herein provide technical solutions to the foregoing technical problem of supporting structural field testing of SoC devices in an end-user system. For example, structural field testing of SoC devices including an on-chip tester in accordance with the teachings of this disclosure does not involve use of an external ATE device. Instead, the on-chip tester included in such disclosed example SoC devices is capable of performing any pre-defined and/or user-defined ATE-based tests without coupling an external ATE-tester to the SoC device. For example, the on-chip tester may run any ATE-based go/no-go tests in the field, rather than being limited to just logic and memory tests.

Some example on-chip testers disclosed herein support compaction using control and data words to reduce test stimuli volume, thereby reducing the memory footprint of the on-chip tester in the SoC device.

Some example on-chip testers disclosed herein couple to and, thus, re-use the existing design-for-testing (DFT) infrastructure implemented in the SoC device. Therefore, such disclosed example on-chip testers are able to perform field testing of existing logic modules (e.g., such as hard macros) implemented in the SoC device without requiring modification of the logic modules to support end-user system-level testing. Also, some such disclosed example on-chip testers support error logging similar to ATE-based testing to facilitate debug and/or error diagnosis when the applied test stimulus fails to yield an expected pattern of result data.

Some example on-chip testers disclosed herein can be used with example test-aware boot loaders, as disclosed herein, to reduce the boot time of the SoC device after testing by the on-chip tester is complete. For example, such test-aware boot loaders can differentiate between a self-test initiated reset (e.g., initiated by the on-chip tester) and a normal reset using a register (e.g., a boot status register) configured by the on-chip tester. By reducing the SoC boot time, such example implementations can enable the SoC device to meet operational boot time requirements.

Example on-chip testers disclosed herein provide an end-user, system-level field test solution that is generic, configurable and re-usable across different SoC devices. For example, some disclosed on-chip testers can be specified at a register transfer level (RTL) and instantiated in an SoC device as a logic module.

Turning to the figures, a block diagram of an example SoC device 100 including an example on-chip tester 105 implemented in accordance with the teachings disclosed herein is illustrated in FIG. 1A. The example SoC device 100 corresponds to an example integrated circuit including one or more logic modules, such as the example logic modules 110A-B illustrated in FIG. 1A. As used herein, the terms "logic module" and, more generally, "module" include any digital logic, logic gate(s), circuitry, hardware, software, hard macros, etc., or combination thereof, having one or more inputs and/or outputs and implementing one or more functions, operations, etc. In some examples, such modules have defined input and output interfaces such that the modules can be re-used across different SoC devices (or, more generally, different integrated circuits).

In the illustrated example of FIG. 1A, the logic modules 110A-B included in the SoC device 100 support design-for-testing (DFT). Accordingly, the logic modules 110A-B include respective interfaces to communicate with an example DFT subsystem 115 included in the example SoC device 100. The DFT subsystem 115 of the illustrated example can be implemented using any DFT technique, such as a scan chain testing technique, capable of routing input test stimuli (e.g., test vectors, test data patterns, etc.) to the appropriate one of the logic modules 110A-B and receiving test responses (e.g., response vectors, response data patterns, etc.) from the corresponding logic module 110A-B. Accordingly, the example DFT subsystem 115 of FIG. 1 includes an example DFT subsystem interface 120 to interface with an example automated test equipment (ATE) tester 125 that is to provide the test stimuli and receive the test responses. The DFT subsystem 115 of the illustrated example also includes logic module interface(s) 128A-B to interface with and apply input test stimuli to the appropriate logic module 110A-B, and to receive the correspondence test responses from the logic module 110A-B. The example DFT subsystem interface 120 and logic module interface(s) 128A-B may be implemented by any types and/or numbers of interfaces, including bus architectures, input/output paths, etc. For example, the DFT subsystem interface 120 of the illustrated example may be a parallel interface (e.g., such as a 32-bit interface), a serial interface, etc.

The example ATE tester 125 of the illustrated example may be implemented by any type(s) and/or number of ATE. In the illustrated example of FIG. 1A, the SoC device 100 includes an example functional pin multiplexer and boundary scan register (BSR) module 130 to provide an example ATE interface 135 between the ATE tester 125 and the DFT subsystem 115. For example, the functional pin multiplexer and BSR module 130 implements BSR functionality and includes pin multiplexers to multiplex one or more external pins of the SoC device 100 to permit the pins to be reused to implement the ATE interface 135.

To support on-chip testing in accordance with the teachings of this disclosure, the SoC device 100 of the illustrated example includes the example on-chip tester 105 to provide test stimuli, stored on-chip, to one or more of the example logic modules 110A-B, and to receive corresponding test responses from the logic modules 110A-B. The on-chip tester 105 of the illustrated example is structured to re-use the example DFT subsystem 115 as the mechanism by which the test stimuli is routed to the appropriate logic module 110A-B and the test results are received from the corresponding logic module 110A-B. To interface with the DFT subsystem 115, the example on-chip tester 105 includes an example test interface multiplexer 140. In the illustrated example of FIG. 1A, the multiplexer 140 selectively couples the DFT subsystem 115 to the on-chip tester 105 or the ATE interface 135 depending on whether the SoC device 100 is to undergo on-chip testing (e.g., using the on-chip tester 105 without connecting to ATE external to the SoC device 100) or ATE testing (e.g., using the ATE tester 125).

Figure 2:
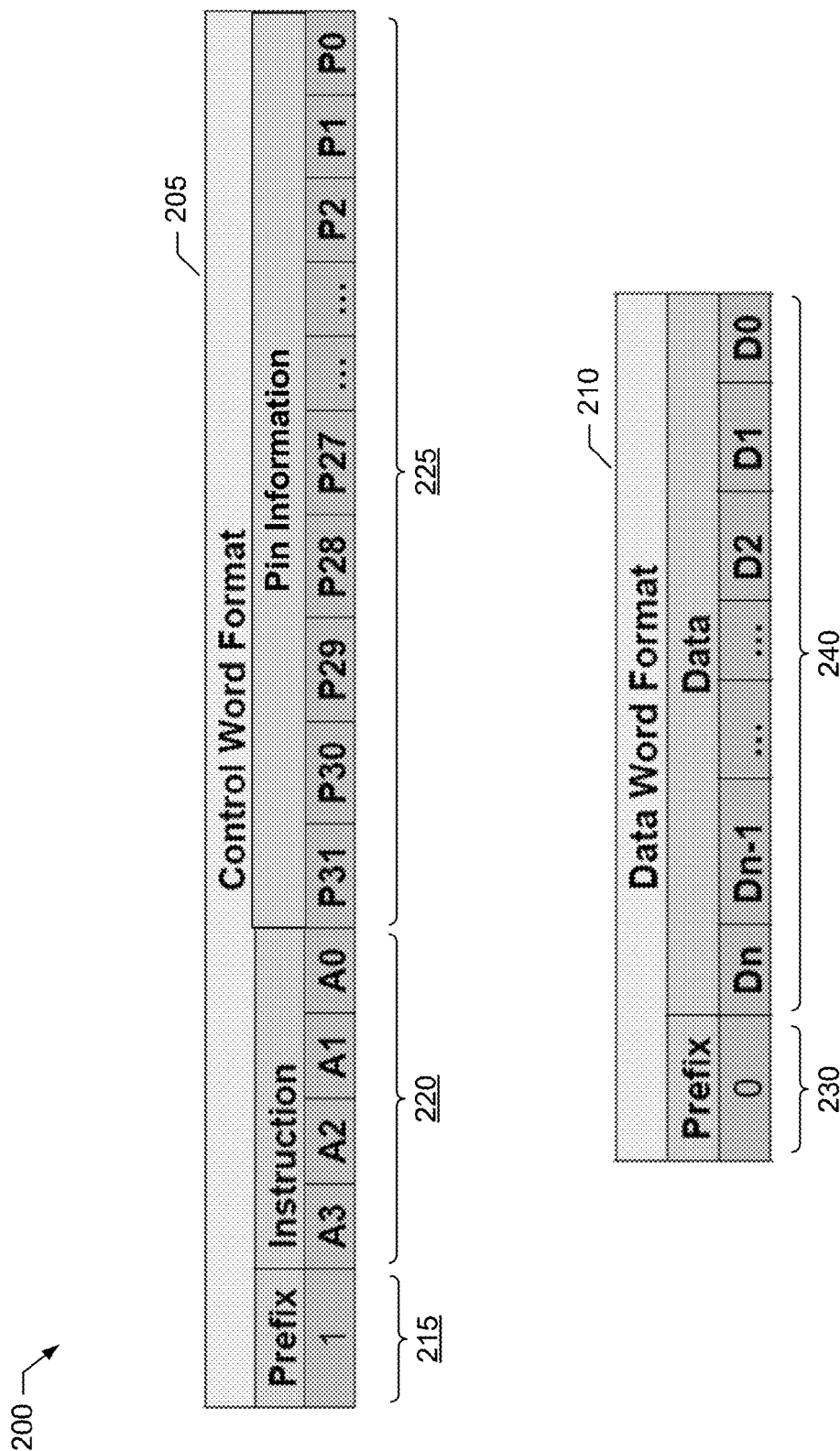
FIG. 2 illustrates an example format for representing test stimuli to be generated by the example on-chip testers of FIGS. 1A and/or 1B.

The example on-chip tester 105 of FIG. 1A includes an example decoder module 145, also referred to as a decoder 145, to decode stored test data to determine test stimuli to apply to the DFT subsystem 115. To store the test data to be decoded by the decoder module 145, the on-chip tester 105 of the illustrated example includes an example read-only memory (ROM) 150 and an example random access memory (RAM). 155. The example ROM 150 is used to store test data in the example SoC device 100 (e.g., during manufacturing of the SoC device 100), whereas the example RAM 155 is used to store test data downloaded to the SoC device 100 (e.g., after manufacturing, such as during runtime). In some examples, the test data stored in the ROM 150 and/or RAM 155, and processed by the decoder module 145, is represented in a compact data format including code words and data words, which reduces the size of the test data relative to the actual (e.g., decoded) test stimuli to be applied to the DFT subsystem 115 and, thus, can achieve a reduction in the footprints of the ROM 150 and/or RAM 155. An example compact data format for representing the stored test data used by the example on-chip tester 105, and the associated decoding processing performed by the example decoder 145, is illustrated in FIGS. 2-3 and described in further detail below.

The example on-chip tester 105 of FIG. 1A also includes an example interconnect interface 160 that includes any appropriate interface logic, circuitry, etc. to interface the on-chip tester 105 with an example SoC interconnect 165 of the SoC device 100. The SoC interconnect 165 of the illustrated example corresponds to a network-on-chip (NoC) communication subsystem implemented in the SoC device 100 to interconnect logic modules of the SoC device 100. In the illustrated example of FIG. 1A, the SoC interconnect 165 interconnects the on-chip tester 105 with an example test initiator 170 that is to control operation of the on-chip tester 105. In some examples, the test initiator 170 is implemented as an on-chip logic module, which may be hard-coded or programmable. In some examples, the test initiator 170 is implemented by a memory-mapped register (MMR) and/or other interface that is configured by another on-chip logic module and/or by a device external to the SoC device 100.

To control operation of the example on-chip tester 105, the on-chip tester 105 includes example configuration register(s) 175 that are configurable by the example test initiator 170 via the SoC interconnect 165 and the interconnect interface 160. For example, the example configuration register(s) 175 include one or more registers to trigger activation of the example decoder module 145, permit loading of test data into the example RAM 155, etc. Also, in the illustrated example of FIG. 1A, the example configuration register(s) 175 include one or more registers coupled to a selection input 180 of the test interface multiplexer 140 to select between coupling the on-chip tester 105 (or, more specifically, the decoder module 145 of the on-chip tester 105) to the DFT subsystem 115, or coupling the ATE interface 135 to the DFT subsystem 115.

Figure 1B:
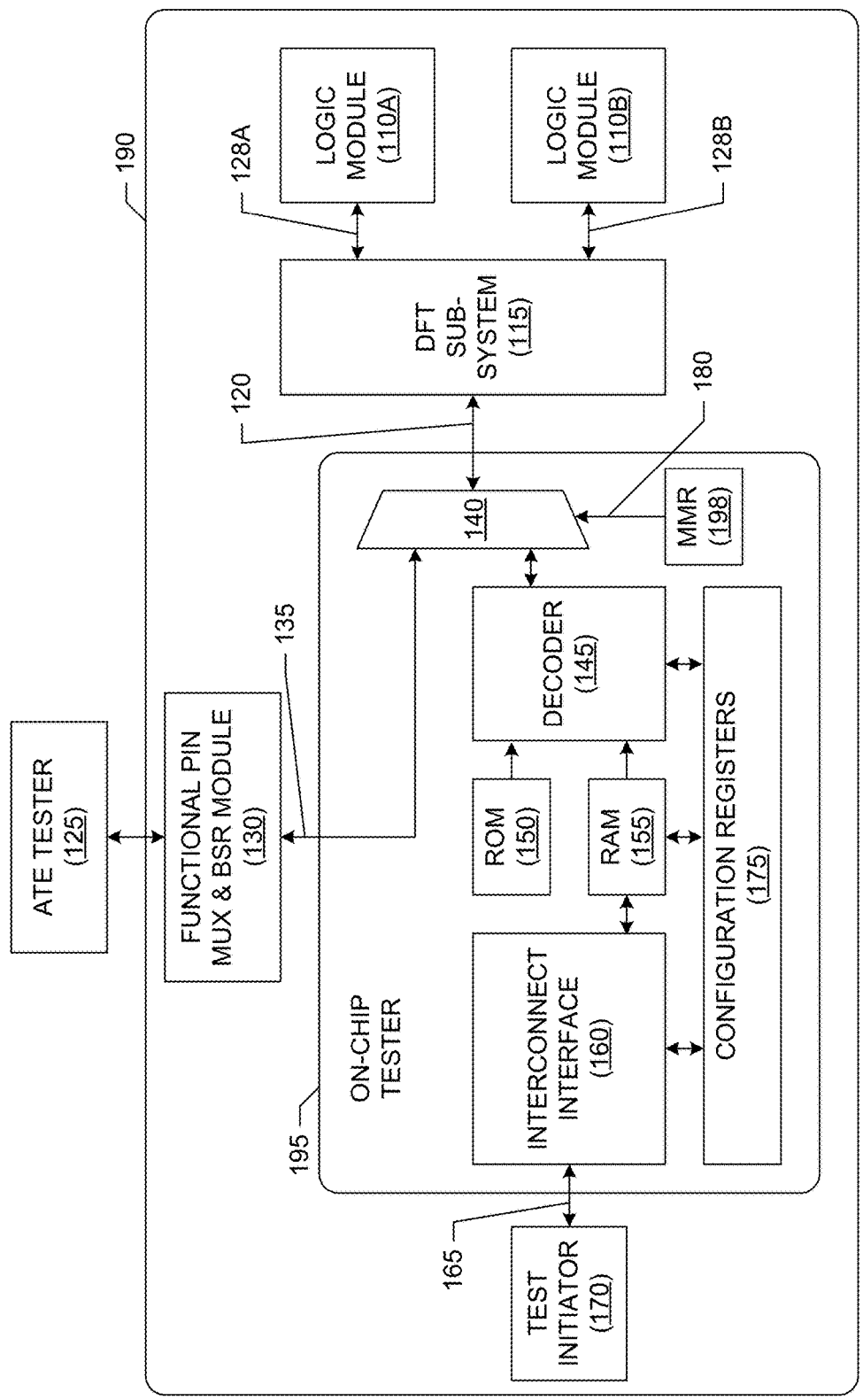
FIG. 1B is a block diagram of a second example SoC device including a second example on-chip tester implemented in accordance with the teachings of this disclosure.

A block diagram of a second example SoC device 190 including a second example on-chip tester 195 implemented in accordance with the teachings disclosed herein is illustrated in FIG. 1B. The second example SoC device 190 and the second example on-chip tester 195 include many elements in common with the first example SoC device 100 and the first example on-chip tester 105 of FIG. 1A. As such, like elements in FIGS. 1A and 1B are labeled with the same reference numerals. The detailed descriptions of these like elements are provided above in connection with the discussion of FIG. 1A and, in the interest of brevity, are not repeated in the discussion of FIG. 1B.

For example, the second example SoC device 190 includes the example logic modules 110A-B, the example DFT subsystem 115, the example DFT subsystem interface 120, the example logic module interface(s) 128A-B, the example functional pin multiplexer and BSR module 130, the example ATE interface 135, the example test interface multiplexer 140, the example SoC interconnect 165, the example test initiator 170 and the example selection input 180 described above in connection with the first example SoC device 100. Furthermore, the second example on-chip tester 195 includes the example decoder module 145, the example ROM 150, the example RAM 155, the example interconnect interface 160 and the example configuration register(s) 175 described above in connection with the first on-chip tester 105. However, in the illustrated example of FIG. 2, the selection input 180 of the test interface multiplexer 140 is coupled to an example MMR 198 (or other interface) which is programmable to select between coupling the on-chip tester 195 (or, more specifically, the decoder module 145 of the on-chip tester 195) to the DFT subsystem 115, or coupling the ATE interface 135 to the DFT subsystem 115. In some examples, the MMR 198 is programmed by the test initiator 170. In some examples, the MMR 198 is programmed by another on-chip logic module and/or by a device external to the SoC device 190.

An example test data format 200 for representing test stimuli to be generated by the example on-chip testers 105 and/or 195 of FIGS. 1A-B is illustrated in FIG. 2. The example format 200 enable the test stimuli, such as test patterns/vectors of bits, to be stored as test data in a compact form, which is then decoded by the example decoder module 145 to generate the test stimuli to be applied to the DFT subsystem 115. For example, such test stimuli can correspond to a test mode entry sequence, automatic test pattern generation (ATPG) vectors for logic test, algorithm information and memory details for a memory test, etc. The example format 200 of FIG. 2 achieves data compaction by exploiting the redundancy in the test stimuli.

In the example format 200 of FIG. 2, test stimuli is represented using a combination of control words having an example control word format 205 and data words having an example data word format 210. The example control word format 205 includes an example prefix 215 set to a value (e.g., such as a logic 1 or some other value) to indicate the word is a control word. The example control word format 205 also includes an example instruction identifier field 220 to identify a particular instruction corresponding to the control word. In the illustrated example of FIG. 2, the instruction identifier field 220 includes 4 bits, thereby supporting 2^4=16 instructions, but the instruction identifier field 220 can include a different number of bits in other examples. Example instructions that may be represented by the instruction field 220 are described in further detail below.

The example control word format 205 further includes an example instruction information field 225 that includes information relevant to the instruction specified by the instruction identifier field 220. For some instructions, the instruction information field 225 specifies information concerning the DFT subsystem interface 120 that is relevant to the particular instruction specified by the instruction identifier field 220. For example, the instruction information field 225 may specify which pins of the DFT subsystem interface 120 are inputs and which are outputs for a given test, which pins are used and which pins are masked (e.g., don't-cares) for a given test, which pins are active (e.g., having values that change from a previous value), etc. For some instructions, the instruction information field 225 specifies one or more parameters relevant to the particular instruction specified by the instruction identifier field 220. For example, the instruction information field 225 may specify a count value, a length value, etc., associated with an instruction specified by the instruction identifier field 220. In the illustrated example of FIG. 2, the instruction information field 225 includes 32 bits, which can support a DFT subsystem interface 120 having, for example, 32 or fewer bits, but the instruction information field 225 can include a different number of bits in other examples.

The example data word format 210 of the example format 200 includes an example prefix 230 set to a value (e.g., such as a logic 0 or some other value different from the control word prefix 215) to indicate the word is a data word. The example data word format 210 also includes an example data field 240 specifying a group of bit values that are to be processed by the decoder module 145 in accordance with the instructions specified by control words having the control word format 205 to generate the test stimuli (e.g., test pattern/vector) to be applied to the DFT subsystem interface 120. In the illustrated example of FIG. 2, the data field 240 has a variable length, but in other examples, the data field 240 may have a fixed length.

Figures 3A, 3B:
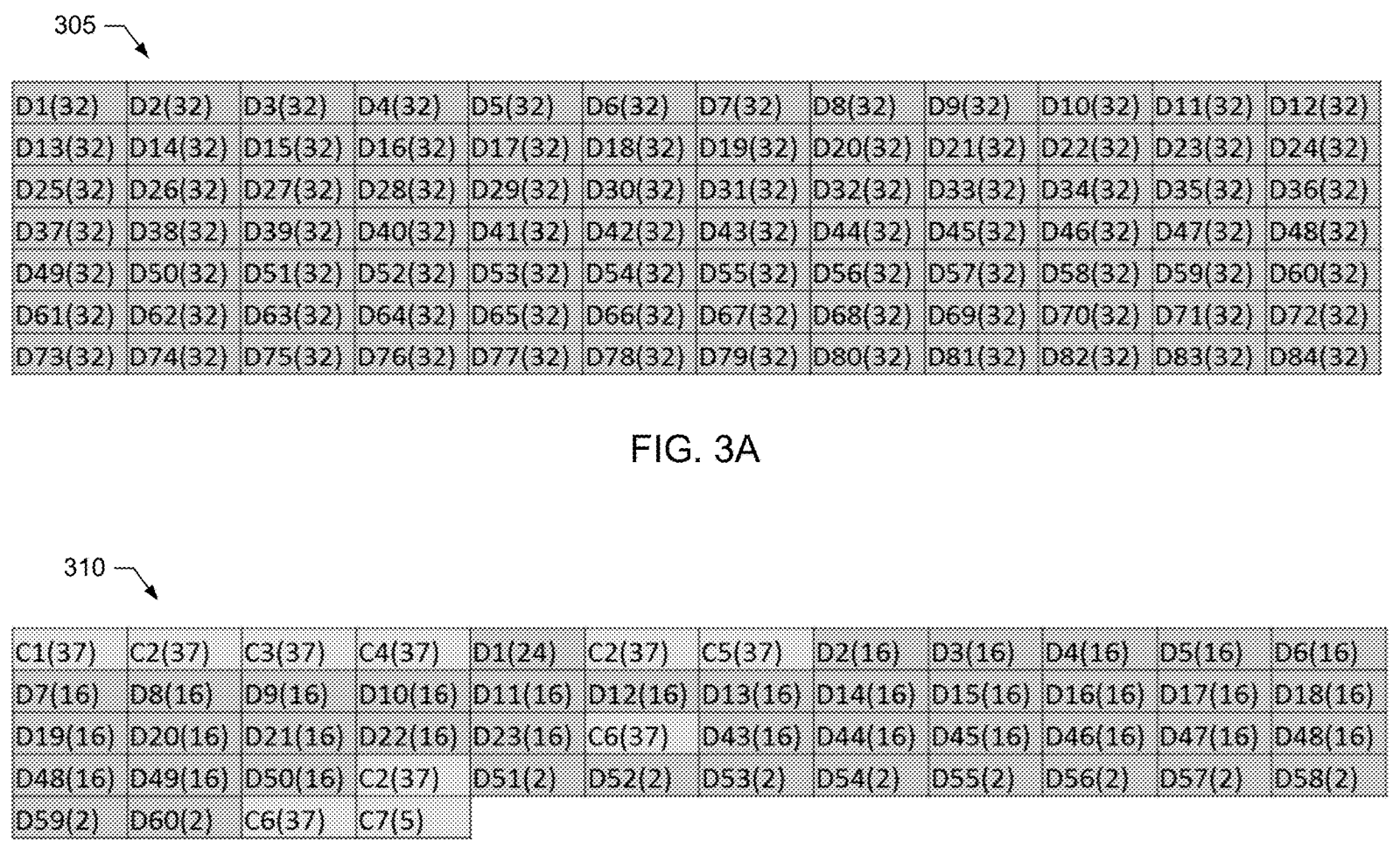

FIGS. 3A-B illustrate an example data compaction that is achievable using the example test data format 200 of FIG. 2. In the illustrated example of FIGS. 3A-B, the notation "DX(Y)" denotes the Xth data word, which has a size of Y bits. In the illustrated example of FIGS. 3A-B, the notation "CX(Y)" denotes the Xth control word, which has a size of Y bits. With this notation in mind, FIG. 3A illustrates example, resulting test stimuli 305 that is to be output by the example decoder module 145. In the illustrated example of FIG. 3A, the test stimuli includes 84 data words each containing 32 bits, for a total size of 2688 bits.

FIG. 3B illustrates example test data 310 that is encoded to represent the example test stimuli 305 using the example format 200. In the illustrated example of FIG. 3B, the encoded test data 310 includes 8 code words each containing 37 bits, one control word containing 5 bits (which represents the end of the test stimuli and is described in further detail below), one data word containing 24 bits, 31 data words each containing 16 bits, and 10 data words each containing 2 bits, for a total of 841 bits. Thus, in the illustrated example of FIGS. 3A-B, the example test data format reduces the amount of data for storing the test stimuli from 2688 bits to 841 bits. In such examples, the sizes of the ROM 150 and/or RAM 155 can be reduced to less than a third of what would be needed to store the test stimuli without the data compaction provided by the example test data format 200.

Example control word instructions that may be represented using the example instruction identifier field 220 and the instruction information field 225 of FIG. 2 are listed in Table 1.

TABLE 1

| Prefix 215 | Instruction identifier field 220 | | | | Instruction information field 225 | Width of the instr. info. field 225 | Instruction Name | Description |
|---|---|---|---|---|---|---|---|---|
| 1 | 0 | 0 | 0 | 0 | 1 = pin used as input<br>0 = pin used as output | 32 | Pin direction set register | Indicates the direction (input or output) of the pins in the DFT subsystem interface 120 |
| 1 | 0 | 0 | 0 | 1 | 1 = pin used as a clock | 32 | Clock information register | Indicates clock information |
| 1 | 0 | 0 | 1 | 0 | 0 = pin used<br>1 = pin not used (e.g., masked) | 32 | Pin mask set register | Indicates pins of the DFT subsystem interface 120 that can be masked (e.g., are don't cares) |
| 1 | 0 | 0 | 1 | 1 | 1 = pin is active<br>0 = pin is not active | 32 | Pin active register | Indicates the pins of the DFT subsystem interface 120 for which the data value is to change. The |

TABLE 1-continued

| Prefix 215 | Instruction identifier field 220 | | | | Instruction information field 225 | Width of the instr. info. field 225 | Instruction Name | Description |
|---|---|---|---|---|---|---|---|---|
| | | | | | | | | values on the other pins are held at the previous value. |
| 1 | 0 | 1 | 0 | 0 | Default value | 32 | Pin default register | Specifies the default value for the pins in the DFT subsystem interface 120 (e.g., for this pins that are unused in the current test) |
| 1 | 0 | 1 | 0 | 1 | Count value | 32 | Repeat count register | The following data word will be applied "count value" times |
| 1 | 0 | 1 | 1 | 0 | Data count, N | 32 | Data block indicator | The subsequent N data words will not have a prefix 230 (to further reduce the test data size). The width of each data word corresponds to the number of pins that are active in the Pin active register |
| 1 | 0 | 1 | 1 | 1 | 1 = pin is active 0 = pin is not active | Equal to the number of 1's in the Instruction information field 225 | Subset pin active register | Only the active pins from the Pin active register are used in this control word. Further data width will be number of "1s" in the Instruction information field 225 of this register |
| 1 | 1 | 0 | 0 | 0 | Unused | N/A | | Unused |
| 1 | 1 | 0 | 0 | 1 | Unused | N/A | | Unused |
| 1 | 1 | 0 | 1 | 0 | Unused | N/A | | Unused |
| 1 | 1 | 0 | 1 | 1 | Unused | N/A | | Unused |
| 1 | 1 | 1 | 0 | 0 | Unused | N/A | | Unused |
| 1 | 1 | 1 | 0 | 1 | Unused | N/A | | Unused |
| 1 | 1 | 1 | 1 | 0 | Unused | N/A | | Unused |
| 1 | 1 | 1 | 1 | 1 | End of test stimuli | 0 | End of test stimuli | This control word indicates the end of the test stimuli |

In the example of Table 1, the control words corresponding to instruction identifiers 0000 to 0110 have a control word size of 37 bits (1 bit for the prefix, 4 bits for the instruction identifier field 220, and 32 bits for the instruction information field 220), whereas the control word corresponding to instruction identifier 1111 has a control word size of 5 bits (because the instruction information field 225 has 0 bits for this control word).

In some examples, the test data encoded in accordance with the example test data format 200 is stored in memory (e.g., the ROM 150 and/or RAM 155) as a continuous bit stream. The width of the data words formatted according to the data word format 210 is determined based on the control word instructions. For example, the width of each data word that would occur after a pin active register (e.g., the instruction 0011 in Table 1) is equal to 1 bit for the prefix 230 (e.g., equal to logic 0) plus a number of bits corresponding to the number of 1's in the instruction information field 225 of the pin active register. In some such examples, the data words are packed such that the drive/compare/clock of the active pins will be present continuously in the data word and inactive pins will be skipped. In some examples, the values of the inactive pins will correspond to the value of pin default register (e.g., instruction 0100 in Table 1) or the previous value that was applied each inactive pin.

As another example, the width of each data word that would occur after a subset pin active register (e.g., the instruction 0111 in Table 1) is equal to 1 bit for the prefix 230 (e.g., equal to logic 0) plus a number of bits corresponding to the number of 1's in the instruction information field 225 of the subset pin active register. In some such examples, the data words are packed such that the drive/compare/clock of the active pins will be present continuously in the data word and inactive pins will be skipped. In some examples, the values of the inactive pins will correspond to the value of pin default register (e.g., instruction 0100 in Table 1) or the previous value that was applied to each inactive pin.

As yet another example, the width of each data word that would occur after a data block register (e.g., the instruction 0110 in Table 1) is equal to a number of bits corresponding to the number of 1's in the instruction information field 225 of the pin active register (e.g., the instruction 0011 in Table 1). The prefixes 230 in the data words following the data block register are omitted because the number of data words is specified by the data count value, N, in the instruction information field 225 of the data block register. In some such examples, the data words are packed such that the drive/compare/clock of the active pins will be present continuously in the data word and inactive pins will be skipped. In some examples, the values of the inactive pins will correspond to the value of pin default register (e.g., instruction 0100 in Table 1) or the previous value that was applied to each inactive pin. The next control/data word following the N data words included in the data block specified by the data block register will start with a prefix 215/230, respectively.

Figure 4A:
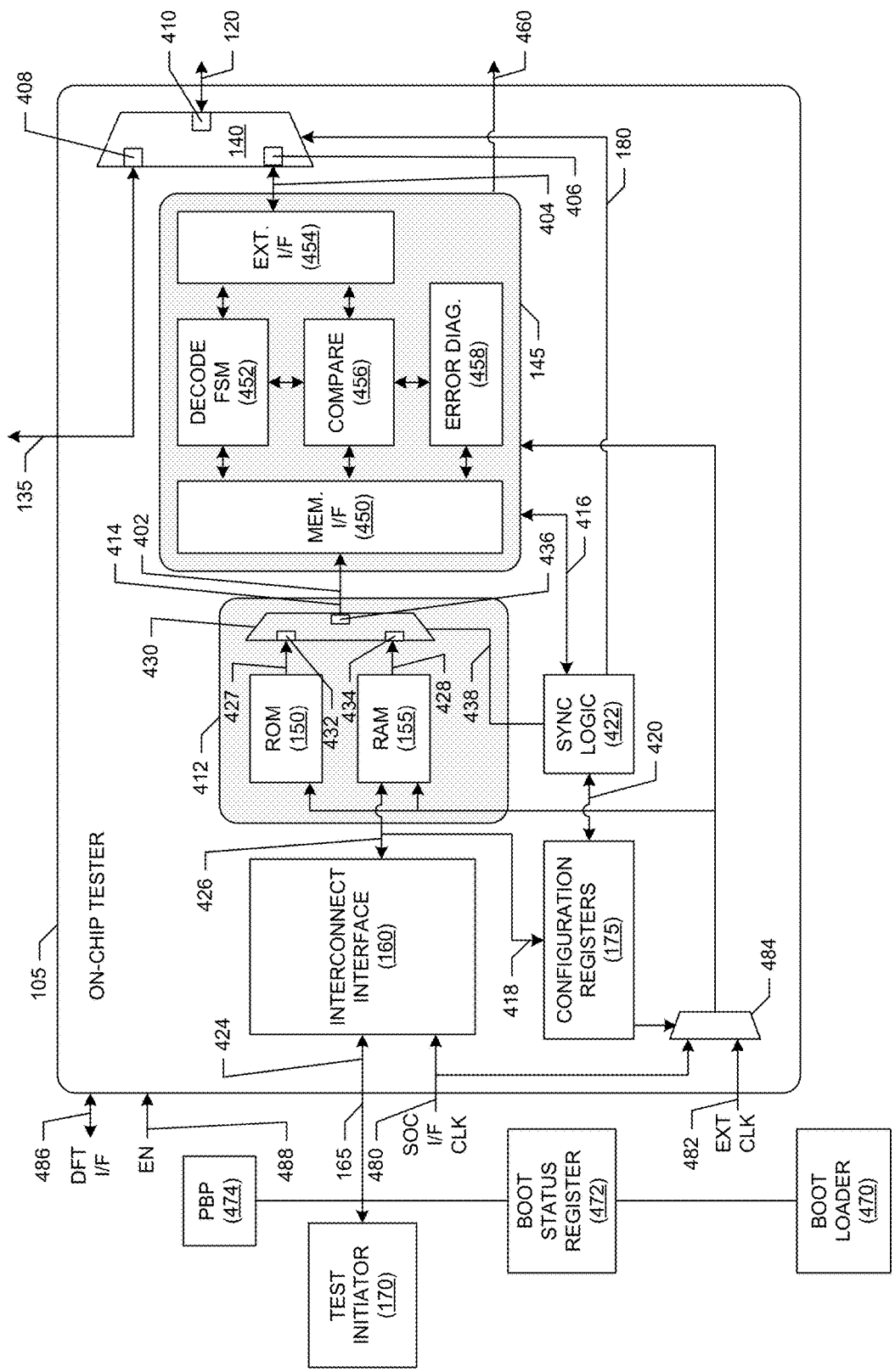
FIGS. 4A-B are block diagrams of example implementations of the example on-chip testers of FIGS. 1A and/or 1B.
Figure 4B:
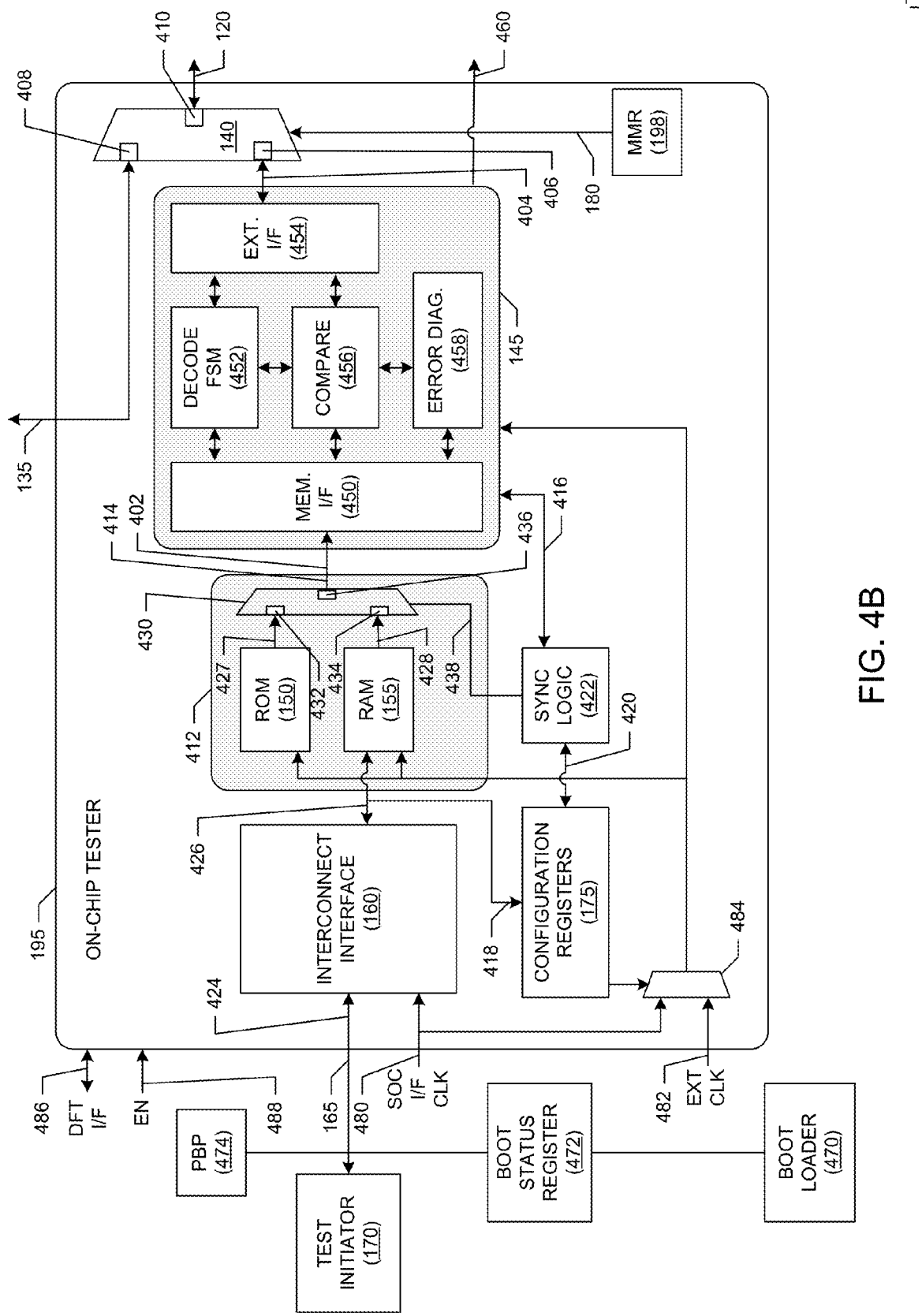

Block diagrams illustrating example implementations of the on-chip testers 105 and/or 195 of FIGS. 1A-B are illustrated in FIGS. 4A-B, respectively. In the illustrated example implementation of FIG. 4A, the example on-chip tester 105 includes the example decoder module 145, which has an example test data input 402 to receive test data for decoding, and an example test stimuli interface 404 to apply test stimuli to and receive corresponding test results from the example DFT subsystem 115. The example on-chip tester 105 of FIG. 4A also includes the example test interface multiplexer module 140, which has a first example multiplexer interface 406 coupled to the test stimuli interface 404, a second example multiplexer interface 408 to be coupled to the example ATE interface 135, a third example multiplexer interface 410 to be coupled to the example DFT subsystem interface 120, and the example interface selection input 180. The example on-chip tester 105 of FIG. 4A further includes an example memory module 412 having an example memory interface 414 coupled to the test data input 402.

In the example on-chip tester 105 of FIG. 4A, the decode module 145 further has one or more example control inputs 416, which may be implemented as example control registers, pins, etc. The example on-chip tester 105 of FIG. 4A also includes the example configuration register(s) 175, which have corresponding register input(s) 418 and register output(s) 420. In the illustrated example, the register output(s) 420 are coupled to the control input(s) 416 via example synchronization logic 422 and/or other intervening circuitry, but in other examples the register output(s) 420 are coupled directly to the control input(s) 416. The example on-chip tester 105 also includes the example interconnect interface 160, which has an example input interface 424 to couple to the example interconnect 165 and an example output interface 426 coupled to the example register input(s) 418 and the example memory module 412.

In the illustrated example of FIG. 4A, the register output(s) 420 of the configuration register(s) 175 are also coupled to the interface selection input 180 of the multiplexer module 140 (e.g., via the synchronization logic 422). Such an arrangement permits the multiplexer module 140 to be controlled via the configuration register(s) 175 and, thus, via the SoC interconnect 165 and interconnect interface 160.

In the illustrated example of FIG. 4A, the memory module 412 of the on-chip tester 105 includes the example ROM memory module 150 and the example RAM memory module 155. The ROM memory module 150 of the illustrated example has an example ROM memory interface 427, and the RAM memory module 155 of the illustrated example has an example RAM memory interface 428. The example on-chip tester 105 of FIG. 4A also includes an example memory multiplexer 430 to select whether the test data to be decoded by the decoder module 145 is to be read from the ROM 150 or the RAM 155 by selectively coupling the ROM memory interface 427 or the RAM memory interface 428 to the memory interface 414 of the memory module 412. The example memory multiplexer 430 has a first example multiplexer interface 432, a second example multiplexer interface 434, a third example multiplexer interface 436, and an example interface selection input 438. In the illustrated example of FIG. 4A, the first example multiplexer interface 432 is coupled to the ROM memory interface 427, the second multiplexer interface 434 is coupled to the RAM memory interface 428 and the test data input 402 of the decoder module 145 is coupled to the third multiplexer interface 436. In the illustrated example of FIG. 4A, one or more of the register output(s) 420 of configuration register (s) 175 is/are coupled to the interface selection input 438 of the memory multiplexer module 430 (e.g., via the synchronization logic 422). Such an arrangement permits the multiplexer module 430 to be controlled via the configuration register(s) 175 and, thus, via the SoC interconnect 165 and interconnect interface 160.

As noted above, the example configuration register(s) 175 are configurable by the example test initiator 170 via the SoC interconnect 165 and the interconnect interface 160 to control operation of the example on-chip tester 105. In some examples, the configuration register(s) 175 are writeable and readable by an SoC interconnect master implementing or otherwise acting as the test initiator 170. In some examples, the configuration register(s) 175 include one or more of an example lock register, an example slice enable register, an example slice status register, an example slice result register, an example abort register, an example busy register, an example domain enable register, an example diagnostic register, etc.

In some examples, the configuration register(s) 175 include the lock register to prevent unintentional updates to the configuration register(s) 175. In some examples, writes to the configuration register(s) 175 are permitted when the configuration register(s) 175 are unlocked by writing a first value (e.g., 0xA in hexadecimal, or some other value) to the lock register of the configuration register(s) 175. Writes to the configuration register(s) 175 may be blocked when the configuration register(s) 175 are locked by writing a second value (e.g., 0x5 or some other value) to the lock register. In some examples, on a reset, the lock register defaults to the second value to cause the configuration register(s) 175 to be locked by default.

In some examples, the test data stored in the example ROM memory module 150 and/or the example RAM memory module 155 of the memory module 412 is organized into slices, with each slice corresponding to, for example, an individual test, test vector, test pattern, etc., to be applied to the DFT subsystem 115. In some such examples, the configuration register(s) 175 include the slice enable register (SER) to select one or more slices to be run at a particular time. In some examples, the SER includes 1 bit to represent each possible slice stored in the ROM memory module 150 and/or the RAM memory module 155 of the memory module 412. For example, if the SER includes 256 bits, then the SER supports selection of up to 256 different possible test data slices. In some examples, multiple slices can be selected by asserting their respective bits in the SER. In some such examples, such multiple slices are selected for decoding by the decoder module 145 and applied to the DFT subsystem 115 sequentially as a single test sequences.

In some examples, the configuration register(s) 175 include the slice status register (SSR) to indicate the status of the slice(s) selected by the SER. In some examples, the SSR includes 1 bit to represent each possible slice stored in the ROM memory module 150 and/or the RAM memory module 155 of the memory module 412. In some such examples, the value of a given bit in the SSR represents the status of executing the test data slice represented by that same bit in the SER. For example, the status bit for a given test data slice may be set to a first value (e.g., logic 1) to indicate that execution of the corresponding test data slice has completed, and may be set to a second value (e.g., logic 0) to indicate that execution of the corresponding test data slice has not completed.

In some examples, the configuration register(s) 175 include the slice result register (SRR) to indicate the result of executing the slice(s) selected by the SER. In some examples, the SRR includes 1 bit to represent each possible slice stored in the ROM memory module 150 and/or the RAM memory module 155 of the memory module 412. In some such examples, the value of a given bit in the SRR represents the result of executing the test data slice represented by that same bit in the SER. For example, the result bit for a given test data slice may be set to a first value (e.g., logic 1) to indicate that execution of the corresponding test data slice had a PASS result, and may be set to a second value (e.g., logic 0) to indicate that execution of the corresponding test data slice had a FAIL result. In some examples, the SRR bit values are considered valid if the corresponding bit values of the SSR indicate the corresponding test data slices have completed execution, and are considered invalid otherwise.

In some examples, the configuration register(s) 175 include the abort register (AR) to cause operation of the on-chip tester 105 to abort. In some such examples, writing a first value (e.g., a logic 1 if the AR is a 1-bit register, or 0x5 if the AR is a multi-bit register) to the AR causes operation of the on-chip tester 105 to abort, whereas writing any other value (e.g., a logic 0 or some other value if the AR is a multi-bit register) is ignored.

In some examples, the configuration register(s) 175 include the busy register (BR), which indicates that the on-chip tester 105 is busy executing a test. In some such examples, the BR has a first value (e.g., a logic 1 if the AR is a 1-bit register, or 0x5 if the AR is a multi-bit register) to indicate the on-chip tester 105 to busy, whereas the BR has another value (e.g., a logic 0 or 0x0 if the AR is a multi-bit register) to indicate the on-chip tester 105 is not busy.

In some examples, the configuration register(s) 175 include a domain register (DE) to specify different hardware domains (e.g., if the SoC device 100 is divided into different testing domains) to which the test data slices are to be applied. In some examples, the DE includes 1 bit to represent each possible hardware domain. In some examples in which the SoC device 100 is divided into different testing domains, the configuration register(s) 175 include different SER, SSR and SRR registers for each test domain.

In some examples, the configuration register(s) 175 include diagnostic register(s), which are updated with diagnostic information that is configured to be output when certain conditions (e.g., error conditions) are detected.

As noted above, the memory module 412 of the on-chip tester 105 includes the ROM memory module 150 and/or the RAM memory module 155 to store the test data to be decoded by the decoder module 145 to determine the test stimuli to be applied to the DFT subsystem 115. As also noted above, in some examples, the test data stored in the ROM memory module 150 and/or the RAM memory module 155 is represented in the compact format 200, which is based on control words having the example control word format 205 and data words having the example data word format 210, and which are decoded by the decoder module 145 to determine the test stimuli (e.g., test vectors, test patterns, etc.). In some examples, the test data is organized into slices, as further noted above.

In some examples, the ROM memory module 150 stores test data corresponding to basic/default test vector specified for the particular SoC device 100 and/or a particular customer that is to use the SoC device 100. In some examples, the RAM memory module 155 includes test data corresponding to additional test vectors to be applied to the SoC device 100 (e.g., which may be customer-specific and/or revised versions of the test data stored in the ROM 150). The source of the test data to store in the RAM memory module 155 may be flash memory included in the SoC device 100, an external memory device (e.g., a universal serial bus (USB) device), etc. The test data is loaded into the RAM memory module 155 via the SoC interconnect 165 through the interconnect interface 160 of the on-chip tester 105. In some examples, the configuration register(s) 175 include a memory selection register (MSR) (or registers) to control the memory multiplexer 430 to select whether the decoder module 145 is to read the test data from the ROM memory module 150 of the RAM memory module 155.

For example, the example decoder module 145 of FIG. 4A includes an example memory interface 450 to read the test data for the slices(s) selected by the SRR and from either the ROM memory module 150 or the RAM memory module 155 based on the setting of the MSR. The example decoder module 145 of FIG. 4A also includes an example decoder state machine 452 to decode the control and data words included in the test data read via the memory interface 450. The resulting test stimuli decoded by the decoder state machine 452 is applied via an example external interface 454 of the decoder module 145 to the DFT subsystem 115. In some examples, the decoded test stimuli has the same form as the stimuli that would be applied by the ATE, such as the ATE tester 125, to the DFT subsystem 115.

In the illustrated example of FIG. 4A, the decoder module 145 includes an example comparator 456 to compare test results received from the DFT subsystem 115 after application of the test stimuli, with corresponding reference results corresponding to the applied test stimuli. In some examples, if there is a mismatch between the test results and reference results for a particular test data slice, the comparator 456 sets the appropriate bit(s) in the SRR of the configuration register(s) 175 to indicate that the corresponding test failed. Otherwise, if the test results and reference results for a particular test data slice match, the comparator 456 sets the appropriate bit(s) in the SRR of the configuration register(s) 175 to indicate that the corresponding test passed.

In the illustrated example of FIG. 4A, the decoder module 145 includes an example error diagnostics module 458 to support debug operations by providing access to test failure data. For example, the error diagnostics module 458 may store error diagnostic information for a number, such as 16 or some other number, of test failures that can be accessed via the SoC interconnect 165 through the interconnect interface 160 (e.g., using an open core protocol (OCP) read). The error diagnostic information may include, for example, information identifying the test slice that yielded the failure, the section(s) within a test slice at which the error occurred, etc.

In some examples, a test slice includes three (3) sections: a setup sequence, a core sequence and an exit sequence. If a failure occurs in the setup sequence, the error diagnostics module 458 may start logging failed data and complete execution of the setup sequence, followed by the core sequencer and the exit sequence. Test execution continues to completion to ensure the on-chip tester 105 exits field test mode gracefully and hands control back to the function modules without corruption. If a failure in the core sequence occurs, the error diagnostics module 458 may start logging failed data and complete execution of the core sequencer, followed by the exit sequence. Test execution continues to completion to ensure the on-chip tester 105 exits field test mode gracefully and hands control back to the function modules without corruption. If a failure in the exit sequence occurs, the error diagnostics module 458 may start logging failed data and complete execution of the exit sequence to ensure test execution continues to completion, as noted above. In some examples, if a failure occurs for a test data slice, the on-chip tester 105 will stop execution after the failed slice completes and not execute any subsequent test data slice configured for execution.

In the illustrated example of FIG. 4A, the decoder module 145 is able to assert one or more example interrupt(s) 460. For example, the interrupts(s) 460 may be asserted when an event has occurred, such as when execution of a programmed sequence of test data slices has completed, when test data has finished being loaded into the RAM 155, etc. In some examples, the interrupt(s) 460 are mapped onto an interrupt cross-bar of the SoC device 100 and routed to, for example, an appropriate master of the SoC interconnect 165 through configuration of one or more of the configuration register(s) 175.

In the illustrated example of FIG. 4A, the on-chip tester 105 is depicted in the context of a portion of the SoC device 100 which includes an example boot loader 470. The example boot loader 470 may correspond to any type(s) and/or number(s) of boot loader(s) 470, such as a ROM boot loader (RBL), a secondary boot loader (SBL), etc., or any combination thereof, that is to boot one or more processors included in the SoC device 100 from instructions stored in one or more ROMs of the SoC device. In the illustrated example, the boot loader 470 is adapted to be aware of the on-chip tester 105. For example, through use of an example boot status register 472, the boot loader 470 can determine whether a reset of an example primary boot processor (PBP) 474 implementing the SoC interconnect 165 was a self-test initiated reset (e.g., initiated by the on-chip tester 105 after completion of a field test procedure) or a normal reset. In some examples, the boot loader 470 performs a first boot procedure (e.g., a normal boot procedure) when the reset of the PBP 474 was not initiated by the on-chip tester 105. In some such examples, the boot loader 470 performs a second boot procedure (e.g., different from the first procedure, such as a warm-reset boot procedure) when the reset of the PBP 474 was initiated by the on-chip tester 105.

The example boot status register 472 may be included in the on-chip tester 105 or implemented external to the on-chip tester 105, but connected to the SoC interconnect 165 and accessible via interconnect interface 160. In some examples, the boot status register 472 defaults to a first value corresponding to a first boot procedure (e.g., a normal boot procedure). However, after a field test procedure completes, the on-chip tester 105 may write a second value corresponding to a second boot procedure (e.g., different from the first procedure, such as a warm-reset boot procedure) and then reset the PBP 474. Following the reset, the boot loader 470 checks the value of the boot status register 472. If the value of the boot status register 472 equals the second value, the boot loader 470 performs the second boot procedure. Otherwise, the boot loader 470 performs the first boot procedure.

In the illustrated example of FIG. 4A, the on-chip tester 105 includes an example SoC interconnect clock input 480 and an example external clock input 482 to receive respective SoC interconnect clock and external clock signals to drive the modules included in the on-chip tester 105. The example on-chip tester 105 of FIG. 4A also includes an example clock multiplexer 484, which is controlled by the configuration register(s) 175, to select between the SoC interconnect clock provided by the SoC interconnect clock input 480 and the external clock provided by the external clock input 482. The example on-chip tester 105 of FIG. 4A further includes an example DFT interface 486 to interface the on-chip tester 105 with the example DFT subsystem 115 (e.g., to permit the on-chip tester 105 itself to undergo testing). In some examples, the on-chip tester 105 of FIG. 4A includes an example domain enable input 488 to enable the on-chip tester 105 (e.g., such as when the SoC device 100 is divided into different hardware domains).

FIG. 4B illustrates an example implementation of the on-chip tester 195 of FIG. 1B. The example implementations illustrated in FIGS. 4A and 4B include many elements in common. As such, like elements in FIGS. 4A and 4B are labeled with the same reference numerals. The detailed descriptions of these like elements are provided above in connection with the discussion of FIG. 4A and, in the interest of brevity, are not repeated in the discussion of FIG. 4B.

For example, the example on-chip tester 195 of FIG. 4B includes the example decoder module 145, the example ROM 150, the example RAM 155, the example interconnect interface 160, the example configuration registers 175, the example selection input 180, the example test data input 402, the example test stimuli interface 404, the first example multiplexer interface 406, the second example multiplexer interface 408, the third example multiplexer interface 410, the example memory module 412, the example memory interface 414, the example control inputs 416, the example register input(s) 418, the example register output(s) 420, the example synchronization logic 422, the example input interface 424, the example output interface 426, the example ROM memory interface 427, the example RAM memory interface 428, the example memory multiplexer 430, the first example multiplexer interface 432, the second example multiplexer interface 434, the third example multiplexer interface 436, the example interface selection input 438, the example memory interface 450, the example decoder state machine 452, the example external interface 454, the example comparator 456, the example error diagnostics module 458, the example interrupt(s) 460, the example boot loader 470, the example boot status register 472, the example PBP 474, the example SoC interconnect clock input 480, the example external clock input 482, the example clock multiplexer 484, the example DFT interface 486 and the example domain enable input 488 of FIG. 4A. However, in the illustrated example of FIG. 4B, the interface selection input 180 of the multiplexer module 140 is coupled to the example MMR 198, which is accessible via a memory interface of the SoC device 100 to select between coupling the on-chip tester 195 (or, more specifically, the decoder module 145 of the on-chip tester 195) to the DFT subsystem 115, or coupling the ATE interface 135 to the DFT subsystem 115.

Figure 5A:
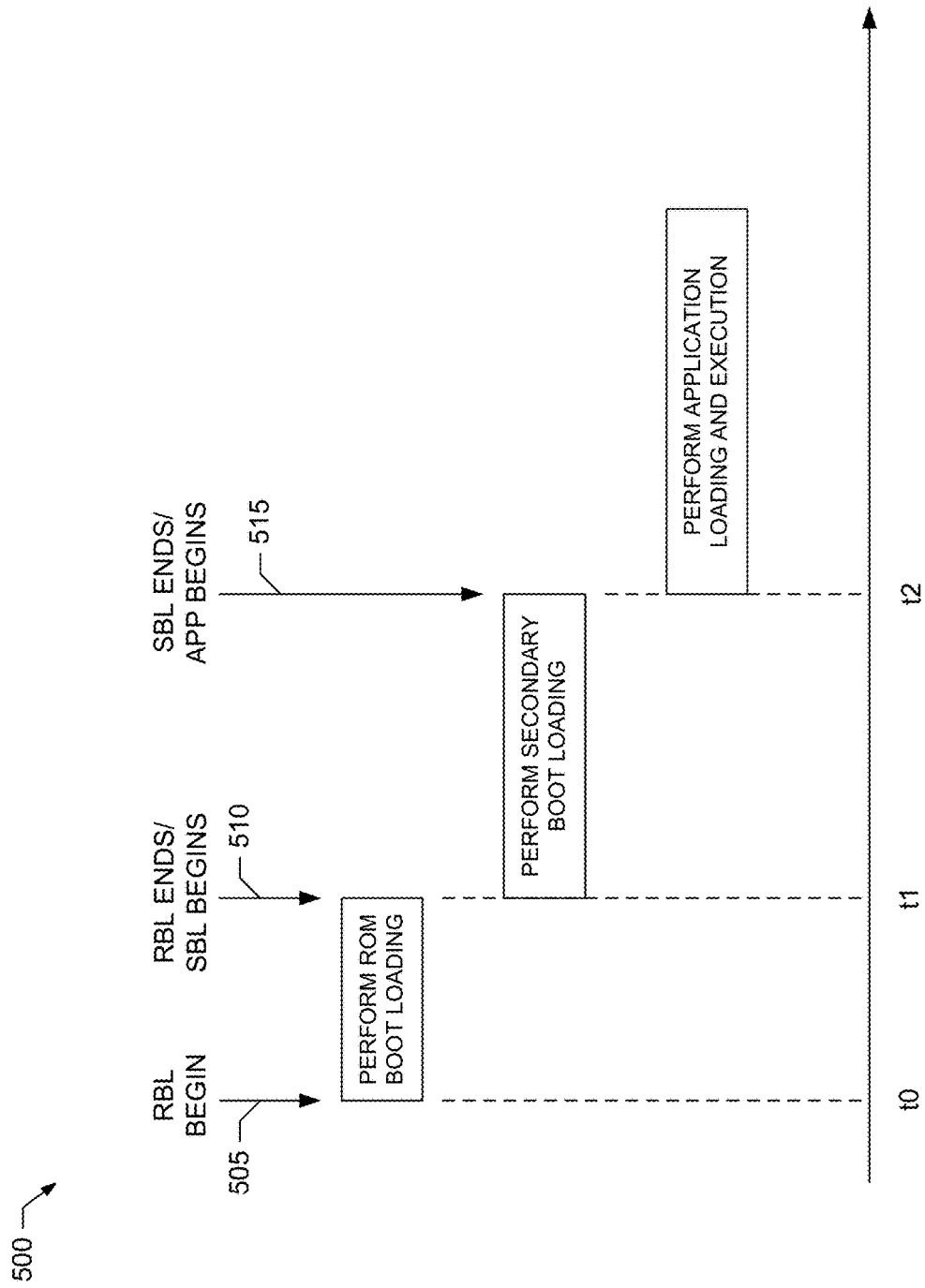
FIGS. 5A-B collectively illustrate example operations performed by an example boot loader illustrated in FIGS. 4A-B.
Figure 5B:
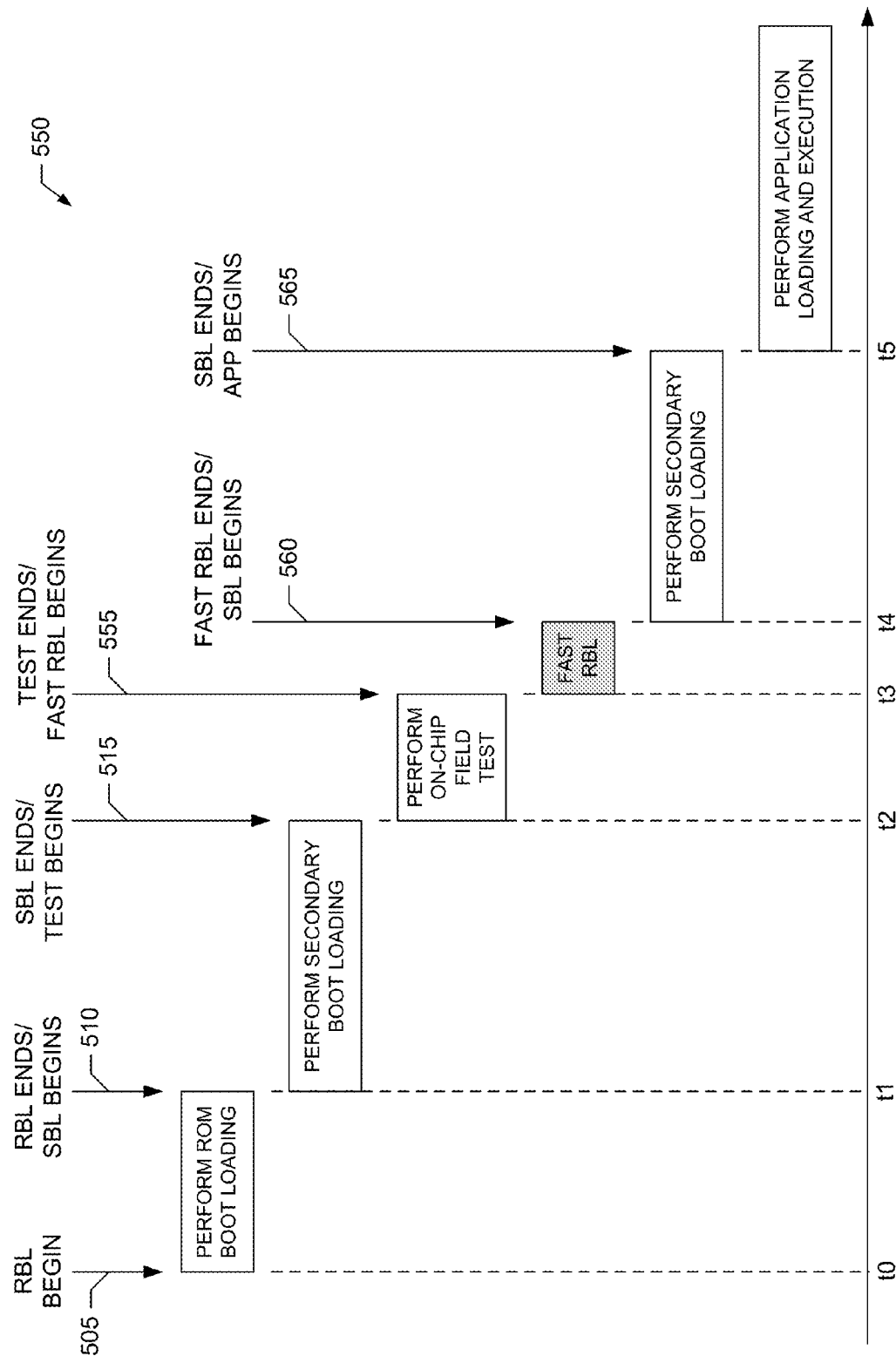

Example operations performed by the boot loader 470 of FIGS. 4A-B are illustrated in FIGS. 5A-B. In the illustrated example of FIGS. 5A-B, the boot loader includes an RBL to support initial booting from ROM, and an SBL to perform further booting from, for example, a serial data interface. FIG. 5A illustrates an example first (e.g., normal) boot procedure 500 performed by the boot loader 470 when the boot status register 472 is set to the first value corresponding to the first (e.g., normal) boot procedure. The example first (e.g., normal) boot procedure 500 begins at operation 505 at which the RBL of the boot status register 472 performs an example ROM boot load procedure after reset of the PBP 474 to start execution of processing modules in the SoC device 100 using a ROM image stored in chip ROM. At operation 510, the ROM boot load procedure ends and the SBL of boot loader 470 then performs a secondary boot load procedure to continue initializing the processing modules in the SoC device 100 using an image loaded from a read/write memory, such as RAM, flash, etc. At operation 515, the secondary boot load procedure ends and application images are able to be loaded and begin execution on the processing modules in the SoC device 100.

FIG. 5B illustrates an example second (e.g., warm or fast) boot procedure 550 performed by the boot loader 470 when the boot status register 472 is set to the second value corresponding to the second (e.g., warm or fast) boot procedure. The example of FIG. 5B illustrates the example second (e.g., warm or fast) boot procedure 550 being performed after the first (e.g., normal) boot procedure 500 was performed due to a prior reset of the PBP 474. As such, the example boot procedure 550 of FIG. 5B begins at the operation 505 at which the RBL of the boot status register 472 performs an example ROM boot load procedure after reset of the PBP 474 to start execution of processing modules in the SoC device 100 using a ROM image stored in ROM. At the operation 510, the ROM boot load procedure ends and the SBL then performs a secondary boot load procedure to continue initializing the processing modules in the SoC device 100 using an SBL image loaded from a read/write memory. At the operation 515, the secondary boot load procedure ends. However, in contrast with the example of FIG. 5A, at the operation 515 of FIG. 5B, the on-chip tester 105/195 is configured to initiate a field test procedure. At operation 555, the field test completes and the on-chip tester 105/195 writes the second value corresponding to the second (e.g., warm or fast) boot procedure to the boot status register 472 and then resets the PBP 474.

The PBP reset at operation 555 causes the boot loader 470 to evaluate the boot status register 472. Because the boot status register 472 is set to the second value, the boot loader 470 performs a second (e.g., warm or fast) ROM boot load procedure that is an abbreviated version of the first (e.g., normal) ROM boot load procedure, which completes at operation 560. For example, the second ROM boot load procedure that begins at operation 555 can forego loading the SBL image as it may already be present in memory by the time operation 510 is performed (e.g., due to the operation 510). Additionally or alternatively, in some examples, relative to the first ROM boot load procedure performed at operation 505, the second ROM boot load procedure that begins at operation 555 can forego performing phase lock loop locking procedures, driver initialization, etc. as such procedures were all performed as part of the first ROM boot load procedure performed at operation 505. At operation 560, the second ROM boot load procedure ends and the SBL of boot loader 470 then performs the secondary boot load procedure to continue initializing the processing modules in the SoC device 100. The secondary boot load procedure completes at operation 565, at which application images are able to be loaded and begin initialization and execution on the processing modules in the SoC device 100. At operation 565, the boot loader 470 also resets the boot status register 472 to the first value corresponding to the first (e.g., normal) boot procedure.

While examples manners of implementing the on-chip testers 105 and 195 are illustrated in FIGS. 1-5B, one or more of the elements, processes and/or devices illustrated in FIGS. 1-5B may be combined, divided, re-arranged, omitted, eliminated and/or implemented in any other way. Further, the example logic modules 110A-B, the example DFT subsystem 115, the example DFT subsystem interface 120, the example logic module interface(s) 128A-B, the example functional pin multiplexer and BSR module 130, the example ATE interface 135, the example test interface multiplexer 140, the example decoder module 145, the example ROM 150, the example RAM 155, the example interconnect interface 160, the example SoC interconnect 165, the example test initiator 170, the example configuration register(s) 175, the example selection input 180, the example MMR 198, the example test data input 402, the example test stimuli interface 404, the first example multiplexer interface 406, the second example multiplexer interface 408, the third example multiplexer interface 410, the example memory module 412, the example memory interface 414, the example control inputs 416, the example register input(s) 418, the example register output(s) 420, the example synchronization logic 422, the example input interface 424, the example output interface 426, the example ROM memory interface 427, the example RAM memory interface 428, the example memory multiplexer 430, the first example multiplexer interface 432, the second example multiplexer interface 434, the third example multiplexer interface 436, the example interface selection input 438, the example memory interface 450, the example decoder state machine 452, the example external interface 454, the example comparator 456, the example error diagnostics module 458, the example interrupt(s) 460, the example boot loader 470, the example boot status register 472, the example PBP 474, the example SoC interconnect clock input 480, the example external clock input 482, the example clock multiplexer 484, the example DFT interface 486, the example domain enable input 488 and/or, more generally, the example on-chip testers 105 and/or 195, and/or the SoC devices 100 and/or 190, may be implemented by hardware, software, firmware and/or any combination of hardware, software and/or firmware. Thus, for example, any of the example logic modules 110A-B, the example DFT subsystem 115, the example DFT subsystem interface 120, the example logic module interface(s) 128A-B, the example functional pin multiplexer and BSR module 130, the example ATE interface 135, the example test interface multiplexer 140, the example decoder module 145, the example ROM 150, the example RAM 155, the example interconnect interface 160, the example SoC interconnect 165, the example test initiator 170, the example configuration register(s) 175, the example selection input 180, the example MMR 198, the example test data input 402, the example test stimuli interface 404, the first example multiplexer interface 406, the second example multiplexer interface 408, the third example multiplexer interface 410, the example memory module 412, the example memory interface 414, the example control inputs 416, the example register input(s) 418, the example register output(s) 420, the example synchronization logic 422, the example input interface 424, the example output interface 426, the example ROM memory interface 427, the example RAM memory interface 428, the example memory multiplexer 430, the first example multiplexer interface 432, the second example multiplexer interface 434, the third example multiplexer interface 436, the example interface selection input 438, the example memory interface 450, the example decoder state machine 452, the example external interface 454, the example comparator 456, the example error diagnostics module 458, the example interrupt(s) 460, the example boot loader 470, the example boot status register 472, the example PBP 474, the example SoC interconnect clock input 480, the example external clock input 482, the example clock multiplexer 484, the example DFT interface 486, the example domain enable input 488 and/or, more generally, the example on-chip testers 105 and/or 195, and/or the SoC devices 100 and/or 190, could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example on-chip testers 105 and/or 195, the SoC devices 100 and/or 190, the example logic modules 110A-B, the example DFT subsystem 115, the example DFT subsystem interface 120, the example logic module interface(s) 128A-B, the example functional pin multiplexer and BSR module 130, the example ATE interface 135, the example test interface multiplexer 140, the example decoder module 145, the example ROM 150, the example RAM 155, the example interconnect interface 160, the example SoC interconnect 165, the example test initiator 170, the example configuration register(s) 175, the example selection input 180, the example MMR 198, the example test data input 402, the example test stimuli interface 404, the first example multiplexer interface 406, the second example multiplexer interface 408, the third example multiplexer interface 410, the example memory module 412, the example memory interface 414, the example control inputs 416, the example register input(s) 418, the example register output(s) 420, the example synchronization logic 422, the example input interface 424, the example output interface 426, the example ROM memory interface 427, the example RAM memory interface 428, the example memory multiplexer 430, the first example multiplexer interface 432, the second example multiplexer interface 434, the third example multiplexer interface 436, the example interface selection input 438, the example memory interface 450, the example decoder state machine 452, the example external interface 454, the example comparator 456, the example error diagnostics module 458, the example interrupt(s) 460, the example boot loader 470, the example boot status register 472, the example PBP 474, the example SoC interconnect clock input 480, the example external clock input 482, the example clock multiplexer 484, the example DFT interface 486 and/or the example domain enable input 488 is/are hereby expressly defined to include a tangible computer readable storage device or storage disk such as a memory, a digital versatile disk (DVD), a compact disk (CD), a Blu-ray disk, etc. storing the software and/or firmware. Further still, the example on-chip testers 105 and/or 195 may include one or more elements, processes and/or devices in addition to, or instead of, those illustrated in FIGS. 1-5B, and/or may include more than one of any or all of the illustrated elements, processes and devices.

Flowcharts representative of example procedures and/or machine readable instructions for implementing the example on-chip testers 105 and/or 195, the SoC devices 100 and/or 190, the example logic modules 110A-B, the example DFT subsystem 115, the example DFT subsystem interface 120, the example logic module interface(s) 128A-B, the example functional pin multiplexer and BSR module 130, the example ATE interface 135, the example test interface multiplexer 140, the example decoder module 145, the example ROM 150, the example RAM 155, the example interconnect interface 160, the example SoC interconnect 165, the example test initiator 170, the example configuration register(s) 175, the example selection input 180, the example MMR 198, the example test data input 402, the example test stimuli interface 404, the first example multiplexer interface 406, the second example multiplexer interface 408, the third example multiplexer interface 410, the example memory module 412, the example memory interface 414, the example control inputs 416, the example register input(s) 418, the example register output(s) 420, the example synchronization logic 422, the example input interface 424, the example output interface 426, the example ROM memory interface 427, the example RAM memory interface 428, the example memory multiplexer 430, the first example multiplexer interface 432, the second example multiplexer interface 434, the third example multiplexer interface 436, the example interface selection input 438, the example memory interface 450, the example decoder state machine 452, the example external interface 454, the example comparator 456, the example error diagnostics module 458, the example interrupt(s) 460, the example boot loader 470, the example boot status register 472, the example PBP 474, the example SoC interconnect clock input 480, the example external clock input 482, the example clock multiplexer 484, the example DFT interface 486 and/or the example domain enable input 488 are shown in FIGS. 6-9. In these examples, the machine readable instructions comprise one or more programs for execution by a processor, such as the processor 1012 and/or 1112 shown in the example processor platform 1000 and/or 1100 discussed below in connection with FIG. 10 and FIG. 11. The one or more programs, or portion(s) thereof, may be embodied in software stored on a tangible computer readable storage medium such as a CD-ROM, a floppy disk, a hard drive, a digital versatile disk (DVD), a Blu-ray Disk™, or a memory associated with the processor 1012 and/or 1112, but the entire program or programs and/or portions thereof could alternatively be executed by a device other than the processor 1012 and/or 1112, and/or embodied in firmware or dedicated hardware (e.g., implemented by an ASIC, a PLD, an FPLD, discrete logic, etc.). Further, although the example procedure(s) and/or machine readable instructions are described with reference to the flowcharts illustrated in FIGS. 6-9, many other methods of implementing the example on-chip testers 105 and/or 195, the SoC devices 100 and/or 190, the example logic modules 110A-B, the example DFT subsystem 115, the example DFT subsystem interface 120, the example logic module interface(s) 128A-B, the example functional pin multiplexer and BSR module 130, the example ATE interface 135, the example test interface multiplexer 140, the example decoder module 145, the example ROM 150, the example RAM 155, the example interconnect interface 160, the example SoC interconnect 165, the example test initiator 170, the example configuration register(s) 175, the example selection input 180, the example MMR 198, the example test data input 402, the example test stimuli interface 404, the first example multiplexer interface 406, the second example multiplexer interface 408, the third example multiplexer interface 410, the example memory module 412, the example memory interface 414, the example control inputs 416, the example register input(s) 418, the example register output(s) 420, the example synchronization logic 422, the example input interface 424, the example output interface 426, the example ROM memory interface 427, the example RAM memory interface 428, the example memory multiplexer 430, the first example multiplexer interface 432, the second example multiplexer interface 434, the third example multiplexer interface 436, the example interface selection input 438, the example memory interface 450, the example decoder state machine 452, the example external interface 454, the example comparator 456, the example error diagnostics module 458, the example interrupt(s) 460, the example boot loader 470, the example boot status register 472, the example PBP 474, the example SoC interconnect clock input 480, the example external clock input 482, the example clock multiplexer 484, the example DFT interface 486 and/or the example domain enable input 488 may alternatively be used. For example, with reference to the flowcharts illustrated in FIGS. 6-9, the order of execution of the blocks may be changed, and/or some of the blocks described may be changed, eliminated, combined and/or subdivided into multiple blocks.

As mentioned above, the example processes of FIGS. 6-9 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 6-9 may be implemented using coded instructions (e.g., computer and/or machine readable instructions) stored on a non-transitory computer and/or machine readable medium such as a hard disk drive, a flash memory, a ROM, a CD, a DVD, a cache, a RAM and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended. Also, as used herein, the terms "computer readable" and "machine readable" are considered equivalent unless indicated otherwise.

Figure 6:
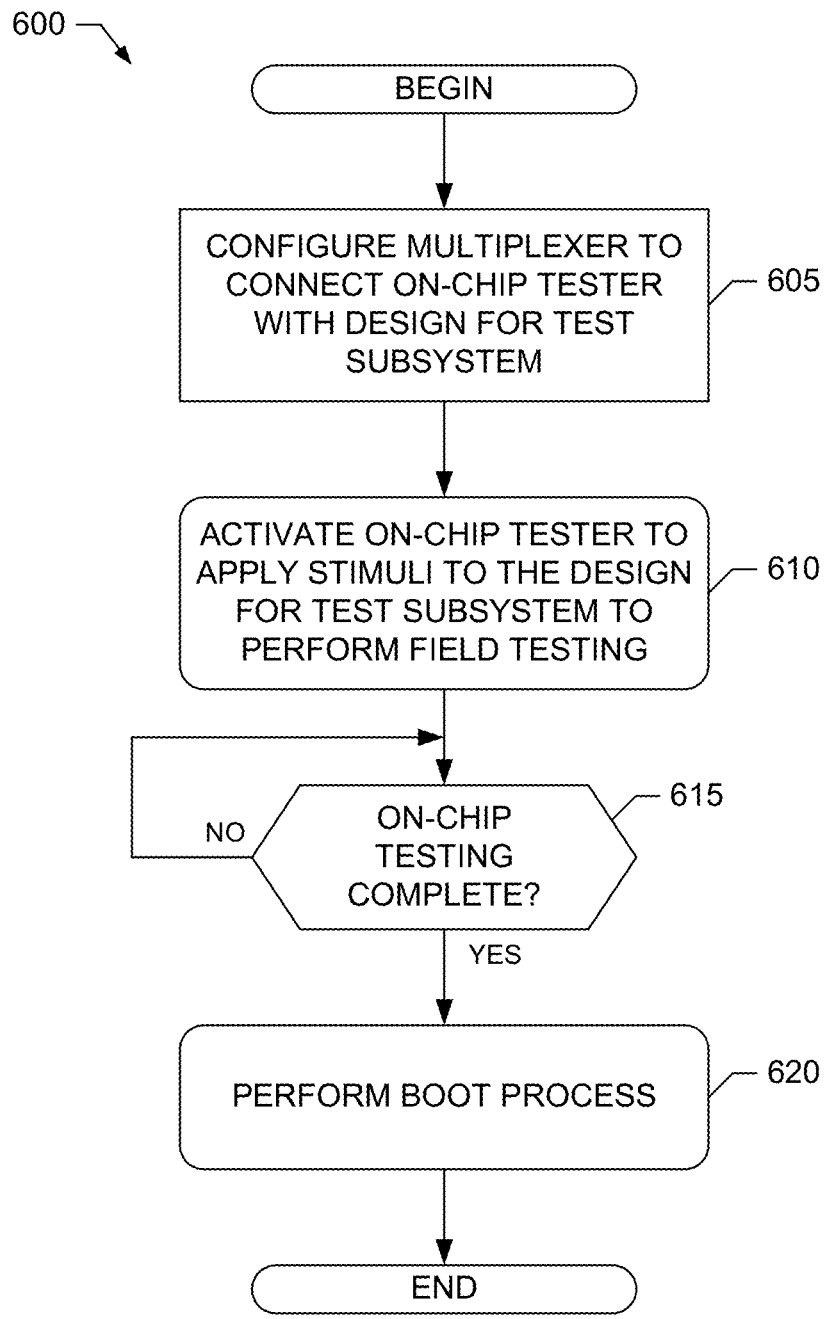
FIG. 6 is a flowchart representative of an example process which may be performed to conduct field testing of the example SoC devices of FIGS. 1A and/or 1B using the example on-chip tester of FIGS. 1A-B and/or 4A-B.

An example program 600 that may be executed to implement the example test initiator 170 of FIGS. 1A-B and/or 4A-B, and/or the example boot loader 470 of FIGS. 4A-B, is represented by the flowchart shown in FIG. 6. With reference to the preceding figures and associated written descriptions, the example program 600 of FIG. 6 begins execution at block 605 at which the example test initiator 170 configures the test interface multiplexer 140 to connect the on-chip tester 105/195 with the DFT subsystem 115. For example, at block 605 the test initiator 170 may set the appropriate configuration register(s) 175 to an appropriate value via the SoC interconnect 165 and interconnect interface 160, or set the MMR 198 to an appropriate value, to cause the test interface multiplexer 140 to couple the decoder module 145 with the DFT subsystem 115.

At block 610, the test initiator 170 activates the on-chip tester 105/195 to perform one or more field tests. For example, at block 610, the test initiator 170 activates the on-chip tester 105/195 by setting the configuration register(s) 175 to the appropriate values described above to cause the decoder module 145 to retrieve and decode selected test data slices, apply the resulting decoded test stimuli to the DFT subsystem 115, and compare the test results with the corresponding reference stimuli. Example operations performed by the on-chip tester 105/195 at block 610 are illustrated in FIG. 7, which is described in further detail below.

Figure 9:
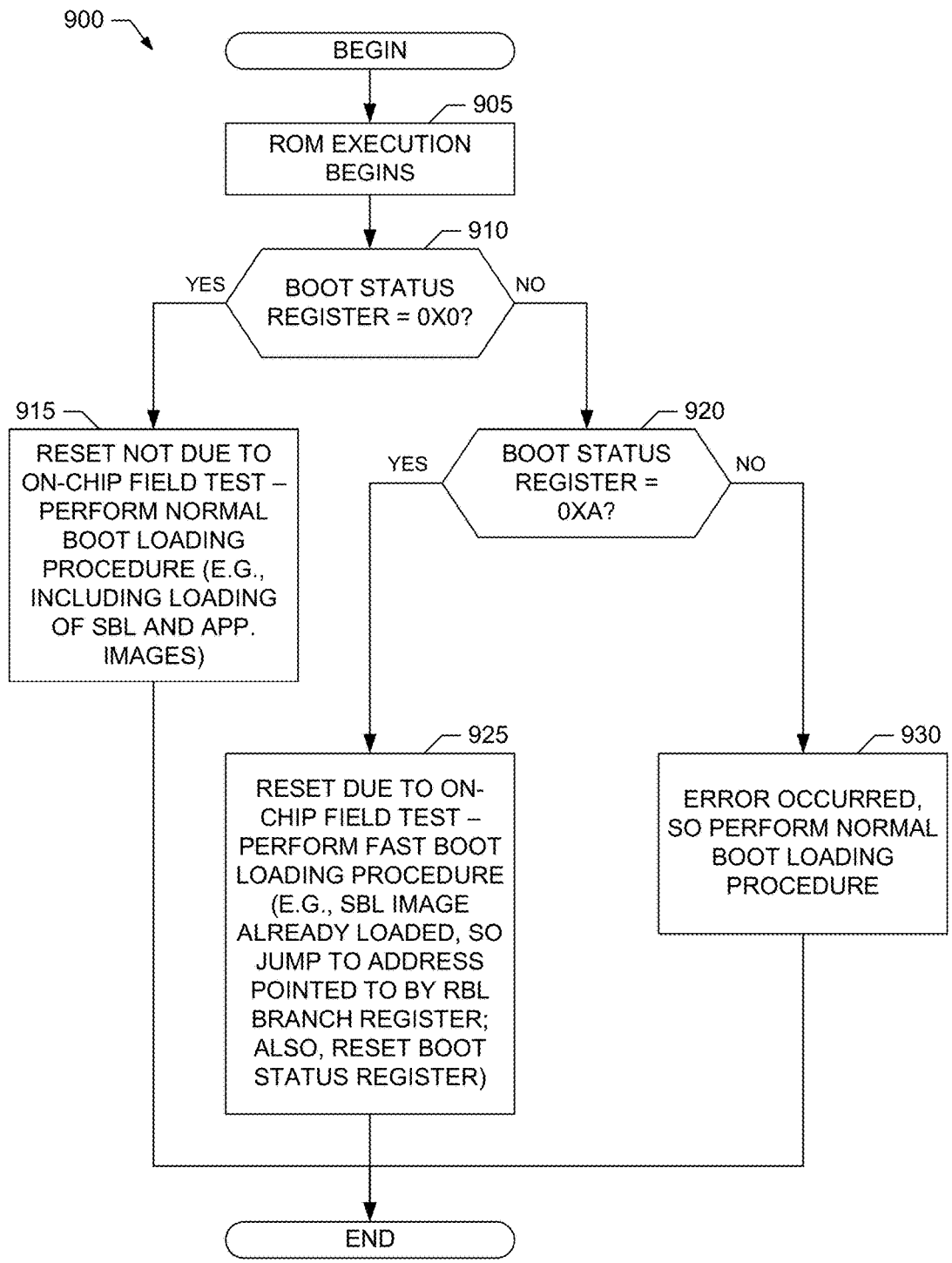
FIG. 9 is a flowchart representative of an example process for booting the example SoC devices of FIGS. 1A and/or 1B.

After on-chip testing at block 610 is complete (block 615), at block 620 the PBP 474 is reset and the boot loader 470 performs a boot process, as described above. For example, at the completion of on-chip testing at block 610, the on-chip tester 105/195 sets the boot status register 472 to a value indicating the reset of the PBP 474 was performed by the chip tester 105/195. Accordingly, at block 620 the boot loader 470 evaluates the value of the boot status register 472 and performs an appropriate boot procedure, as described above. Example instructions that may be executed to perform the processing at block 620 are illustrated in FIG. 9, which is described in further detail below.

Figure 7:
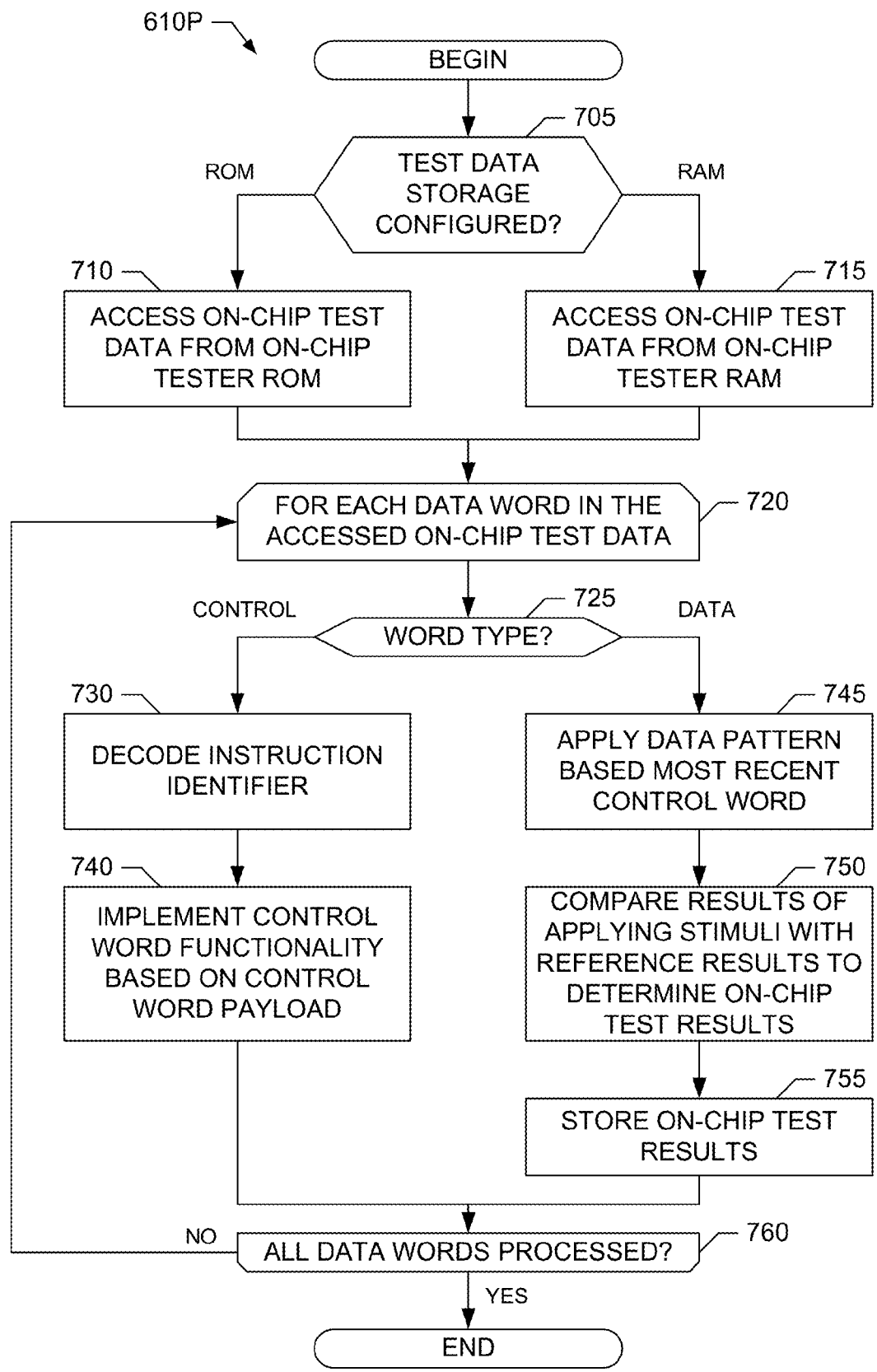
FIG. 7 is a flowchart representative of an example process which may be performed by the example on-chip tester of FIGS. 1A-B and/or 4A-B to test a logic module of the example SoC devices of FIGS. 1A and/or 1B.

Example operations 610P implemented by the on-chip tester 105/195 to perform the processing at block 610 of FIG. 6 are represented by the flowchart shown in FIG. 7. The example operations 610P begin after the on-chip tester 105/195 has been activated by the test initiator 170. The example operations 610P at block 705 at which the memory multiplexer 430 determines whether the ROM module 150 or the RAM module 155 has been selected to provide the test data to be decoded by the decoder module 145. If the ROM module 150 has been selected (block 705), then at block 710 the memory multiplexer 430 couples the ROM memory interface 427 to the test data input 402 of the decoder module 145 to permit the decoder module 145 to access the on-chip test data stored in the ROM module 150. However, if the RAM module 155 has been selected (block 705), then at block 715 the memory multiplexer 430 couples the RAM memory interface 428 to the test data input 402 of the decoder module 145 to permit the decoder module 145 to access the on-chip test data stored in the RAM module 155.

Next, at block 720 the decoder module 145 begins processing the test data accessed at block 710 or 715 per the selection made at block 705. Also, in some examples, the decoder module 145 processes particular portions of the test data stored in the selected ROM module 150 or RAM module 155 depending on the test data slice information programmed into the configuration register(s) 175, as described above. For example, for the next word in the accessed test data, the decoder module 145 determines the word's type at block 725. If the word type corresponds to the control word format 205 (block 725), then at block 730 the decoder module 145 decodes the instruction identifier field 220 of the control word to determine the instruction represented by the control word. At block 740, the decoder module 145 then implements control word functionality corresponding to the decoded instruction and based on the payload (e.g., instruction information field 225) of the control word, as described above in connections with FIGS. 2-3.

However, if the next word to be decoded by the decoder module 145 corresponds to the data word format 210 (block 725), then at block 745 the decoder module 145 applies the data pattern represented by the data word to the DFT subsystem 115 according to the instruction represented by the most recent control word decoded by the decoder module 145. At block 750, the comparator 456 compares, as described above, the test results, which are obtained from the DFT subsystem 115 in response to applying the test stimuli, to corresponding reference results expected when the test stimuli yield a passing (e.g., or positive result). At block 755, the comparator 456 and/or error diagnostics module 458 store the on-chip test results in the appropriate configuration register(s) 175. At block 760, decoding continues until all words from the selected test data slices are processed.

Figure 8:
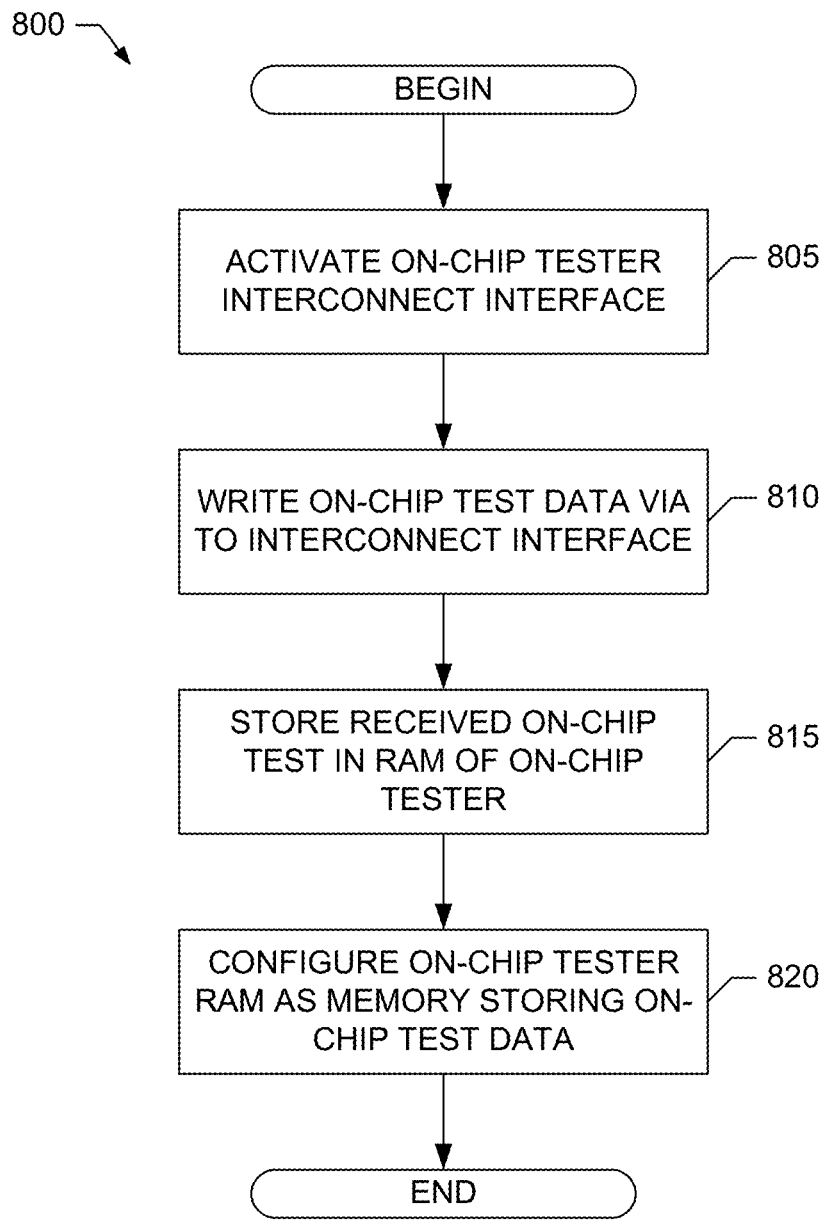
FIG. 8 is a flowchart representative of example machine readable instructions that may be executed by an example test initiator associated with the example SoC devices of FIGS. 1A and/or 1B to download test data to the example on-chip testers of FIGS. 1A-B and/or 4A-B.

An example program 800 that may be executed by the example test initiator 170 of FIGS. 1A-B to download test data to the on-chip tester 105/195 of FIGS. 1A-B is represented by the flowchart shown in FIG. 8. With reference to the preceding figures and associated written descriptions, the example program 800 of FIG. 8 begins execution at block 805 at which the example test initiator 170 activates the interconnect interface 160 of the on-chip tester 105/195 to receive test data (e.g., by programming an appropriate one of the configuration register(s) 175). At block 810, the test initiator 170 causes test data to be written from a source (e.g., on-chip flash memory, external memory, etc.) to the interconnect interface 160 of the on-chip tester 105/195. At block 815, the interconnect interface 160 causes the test data to be written to the RAM module 155 of the on-chip tester 105/195. At block 820, the test initiator 170 configures the memory multiplexer 430 of the on-chip tester 105/195 (e.g., by programming an appropriate one of the configuration register(s) 175) to cause test data to be read from the RAM module 155.

An example program 900 that may be executed to implement the example boot loader 470 of FIGS. 4A-B is represented by the flowchart shown in FIG. 9. With reference to the preceding figures and associated written descriptions, the example program 900 of FIG. 9 begins execution at block 905 at which the boot loader 470 begins execution of a ROM boot loader in response to a reset of the PBP 474. At block 910, the boot loader 470 examines the value of the boot status register 472. If the value of the boot status register 472 is a first value (e.g., a value of 0x0) corresponding to a first boot procedure (e.g., a normal boot procedure), at block 915 the boot loader 470 performs the first (e.g., normal) boot procedure. For example, the first (e.g., normal) boot procedure may correspond to a complete boot loading procedure, which involves loading a supplemental boot image after execution of the ROM boot image completes, and which occurs when the reset was not caused by field testing performed by the on-chip tester 105/195.

However, if the value of the boot status register 472 is not the first value, at block 920 the boot loader 470 determines if the value of the boot status register 472 is a second value (e.g., a value of 0xA) corresponding to a second boot procedure (e.g., a fast or warm boot procedure). If the value of the boot status register 472 is the second value, at block 925 the boot loader 470 performs the second (e.g., fast or warm) boot procedure. For example, the second (e.g., fast or warm) boot procedure may correspond to an abbreviated boot loading procedure, which skips loading of the supplemental boot image after execution of the ROM boot image completes, and which occurs when the reset was caused by field testing performed by the on-chip tester 105/195.

However, if the value of the boot status register 472 is not the second value (block 920), then an error has occurred. In such examples, at block 930 the boot loader 470 performs the first (e.g., normal) boot procedure.

Figure 10:
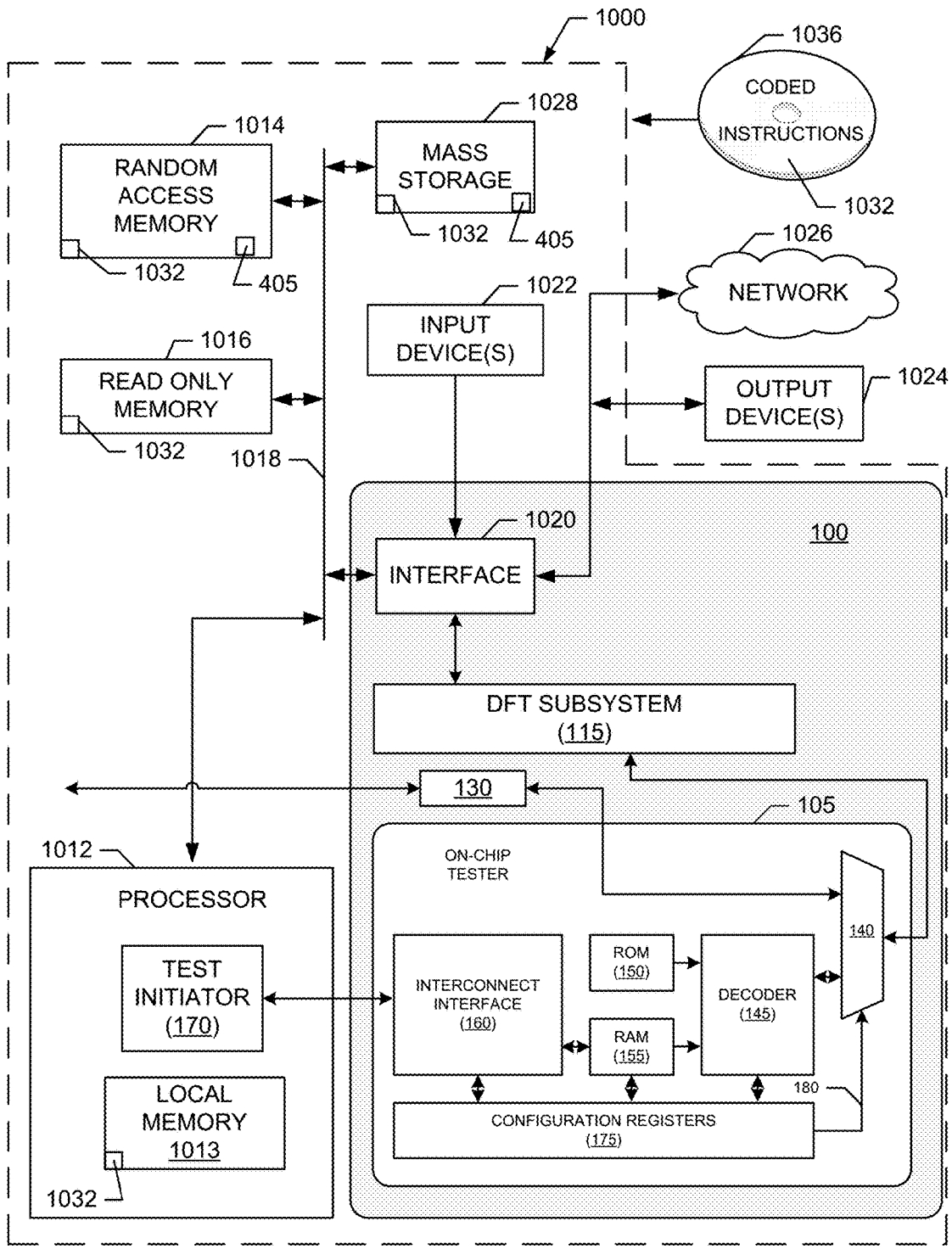
FIG. 10 is a block diagram of an example processor platform including the example SoC device of FIGS. 1A and/or 4A and structured to execute machine readable instructions to perform field testing of the example SoC devices using the example on-chip testers of FIGS. 1A and/or 4A in accordance with the example processes of FIGS. 6-8 and/or 9.

FIG. 10 is a block diagram of an example processor platform 1000 capable of executing the instructions of FIGS. 6-9 to implement the example on-chip tester 105 of FIGS. 1A and/or 4A. The processor platform 1000 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box a digital camera, and/or any other type of computing device and/or consumer electronics device, etc.

The processor platform 1000 of the illustrated example includes a processor 1012. The processor 1012 of the illustrated example is hardware. For example, the processor 1012 can be implemented by one or more integrated circuits, logic circuits, microprocessors or controllers from any desired family or manufacturer. In the illustrated example of FIG. 10, the processor 1012 is configured via example instructions 1032 to implement the example test initiator 170 of FIGS. 1A and/or 4A.

The processor 1012 of the illustrated example includes a local memory 1013 (e.g., a cache). The processor 1012 of the illustrated example is in communication with a main memory including a volatile memory 1014 and a non-volatile memory 1016 via a link 1018. The link 1018 may be implemented by a bus, one or more point-to-point connections, etc., or a combination thereof. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), and/or a PCI express interface. In the illustrated example of FIG. 10, the interface circuit 1020 is implemented, at least in part, by the example SoC device 100 of FIGS. 1A and/or 4A, in which the interface circuit 1020 corresponds to one or more of the logic modules 110A-B included in the SoC device 100.

In the illustrated example, one or more input devices 1022 are connected to the interface circuit 1020. The input device(s) 1022 permit(s) a user to enter data and commands into the processor 1012. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 1000, can allow the user to control the computer system and provide data to the computer using physical gestures, such as, but not limited to, hand or body movements, facial expressions, and face recognition.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID (redundant array of independent disks) systems, and digital versatile disk (DVD) drives.

Coded instructions 1032 corresponding to the instructions of FIGS. 6-9 may be stored in the mass storage device 1028, in the volatile memory 1014, in the non-volatile memory 1016, in the local memory 1013 and/or on a removable tangible computer readable storage medium, such as a CD or DVD 1036.

Figure 11:
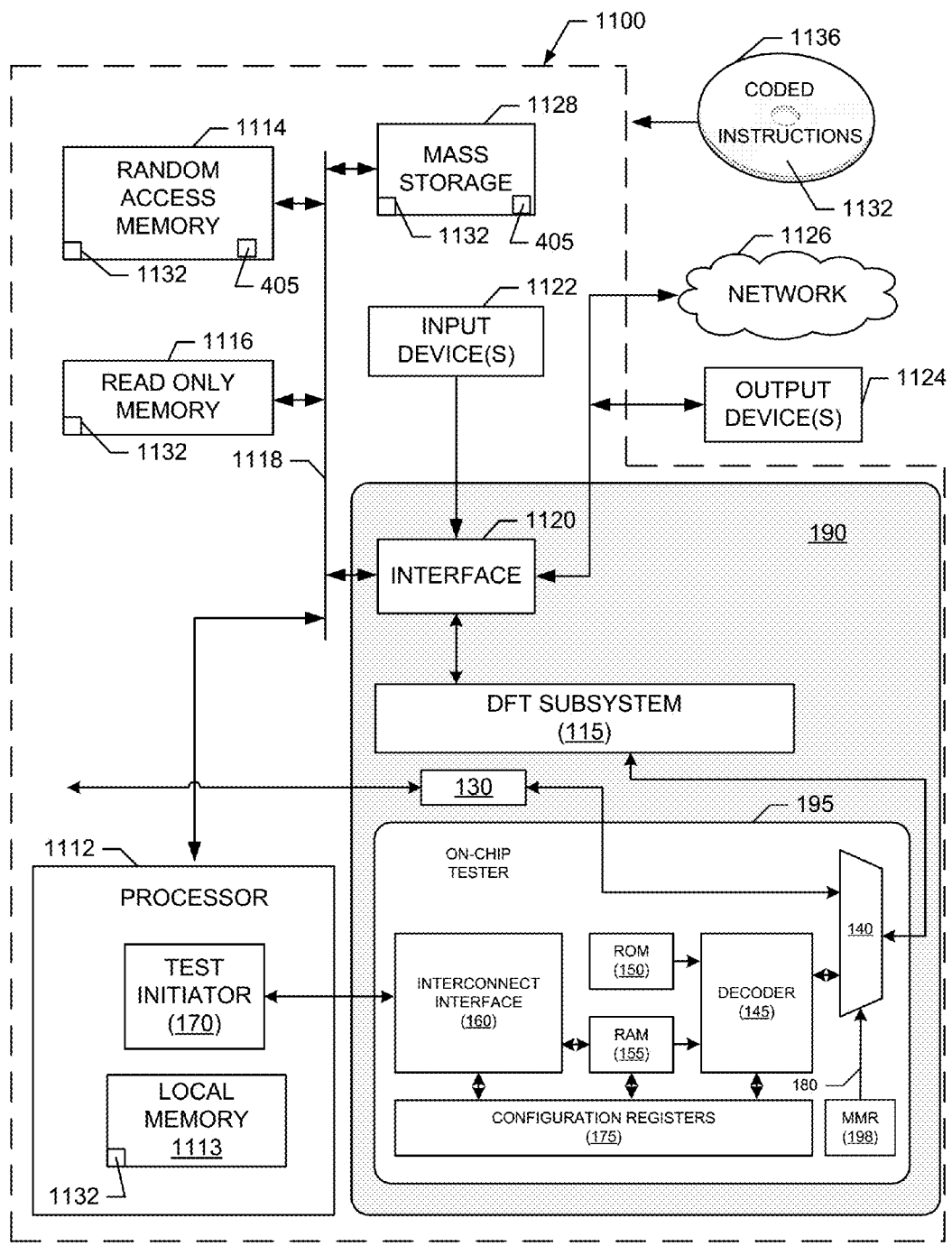
FIG. 11 is a block diagram of an example processor platform including the example SoC device of FIGS. 1B and/or 4B and structured to execute machine readable instructions to perform field testing of the example SoC devices using the example on-chip testers of FIGS. 1B and/or 4B in accordance with the example processes of FIGS. 6-8 and/or 9.

FIG. 11 is a block diagram of an example processor platform 1100 capable of executing the instructions of FIGS. 6-9 to implement the example on-chip tester 195 of FIGS. 1B and/or 4B. The processor platform 1100 can be, for example, a server, a personal computer, a mobile device (e.g., a cell phone, a smart phone, a tablet such as an iPad™), a PDA, an Internet appliance, a DVD player, a CD player, a digital video recorder, a Blu-ray player, a gaming console, a personal video recorder, a set top box a digital camera, and/or any other type of computing device and/or consumer electronics device, etc.

The processor platform 1100 of the illustrated example includes a processor 1112. The processor 1112 of the illustrated example is hardware. For example, the processor 1112 can be implemented by one or more integrated circuits, logic circuits, microprocessors or controllers from any desired family or manufacturer. In the illustrated example of FIG. 11, the processor 1112 is configured via example instructions 1132 to implement the example test initiator 170 of FIGS. 1B and/or 4B.

The processor 1112 of the illustrated example includes a local memory 1113 (e.g., a cache). The processor 1112 of the illustrated example is in communication with a main memory including a volatile memory 1114 and a non-volatile memory 1116 via a link 1118. The link 1118 may be implemented by a bus, one or more point-to-point connections, etc., or a combination thereof. The volatile memory 1114 may be implemented by SDRAM, DRAM, RDRAM and/or any other type of random access memory device. The non-volatile memory 1116 may be implemented by flash memory and/or any other desired type of memory device. Access to the main memory 1114, 1116 is controlled by a memory controller.

The processor platform 1100 of the illustrated example also includes an interface circuit 1120. The interface circuit 1120 may be implemented by any type of interface standard, such as an Ethernet interface, a USB, and/or a PCI express interface. In the illustrated example of FIG. 11, the interface circuit 1120 is implemented, at least in part, by the example SoC device 190 of FIGS. 1B and/or 4B, in which the interface circuit 1120 corresponds to one or more of the logic modules 110A-B included in the SoC device 190.

In the illustrated example, one or more input devices 1122 are connected to the interface circuit 1120. The input device(s) 1122 permit(s) a user to enter data and commands into the processor 1112. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 1100, can allow the user to control the computer system and provide data to the computer using physical gestures, such as, but not limited to, hand or body movements, facial expressions, and face recognition.

One or more output devices 1124 are also connected to the interface circuit 1120 of the illustrated example. The output devices 1124 can be implemented, for example, by display devices (e.g., an LED, an OLED, a liquid crystal display, a CRT display, a touchscreen, a tactile output device, a printer and/or speakers). The interface circuit 1120 of the illustrated example, thus, typically includes a graphics driver card, a graphics driver chip or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a DSL, a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID systems, and DVD drives.

Coded instructions 1132 corresponding to the instructions of FIGS. 6-9 may be stored in the mass storage device 1128, in the volatile memory 1014, in the non-volatile memory 1116, in the local memory 1013 and/or on a removable tangible computer readable storage medium, such as a CD or DVD 1136.

On-chip testing, as disclosed, above may provide many benefits. For example, on-chip testing using the example on-chip testers 105/195 disclosed herein can enable field testing of pre-existing logic modules (e.g., hard macros, which include logic cores (e.g., specified in RTL) that are not intended to be modified by the chip designer) without modification to the logic modules. Also, in some examples, on-chip testing using the example on-chip testers 105/195 disclosed herein is configurable via software (e.g., via the example field test initiator 170) and field test execution at boot, runtime and/or shutdown can be chosen, with failures being stored and continued operation after a failure being possible. Furthermore, in some examples, on-chip testing using the example on-chip testers 105/195 disclosed herein can be generic in that any test vector executable via an ATE tester (e.g., the ATE tester 125), can be executed via the on-chip testers 105/195. Also, in some examples, on-chip testing using the example on-chip testers 105/195 disclosed herein can be agnostic in that the on-chip testers 105/195 may operate independent from any pattern-compression tool. Furthermore, in some examples, any test stimulus can be applied at runtime by downloading and running the test stimulus from the example RAM 155 of the on-chip testers 105/195.

Other possible advantages associated with on-chip testing using the example on-chip testers 105/195 disclosed herein include, but are not limited to:

1) the capability to provide an easily re-usable hardware solution to support structural field testing even if the logic modules (e.g., hard-macros) are not designed to support field test;

2) the capability to provide an added advantage for the customer to decide what tests he/she would like to run at run-time through an external interface;

3) the capability to provide support for diagnostic capabilities to indicate any field test failures, which can enhances debug ability;

4) the capability to provide efficient data compaction techniques to reduce the size (e.g., footprint) of the stored test stimuli;

5) the capability to provide a solution utilizing the idle time of the logic modules, with flexibility to run independent field tests within as low as 250 microseconds (μs), and configure multiple independent tests to run together;

6) the capability to handle interrupts, selectively run field tests on targeted logic modules without affecting other SoC functionality, and error logging; and 7) the capability to meet safety goals specified by ISO 26262 to meet the ASIL standards.

Example methods and apparatus directed to on-chip field testing have been disclosed. Example aspects of on-chip field testing disclosed herein include an on-chip tester comprising a decoder to decode stored test data to determine test stimuli to apply to a design-for-testing subsystem of an integrated circuit, and a multiplexer responsive to a control input to select between at least one of coupling the decoder to the design-for-testing subsystem or coupling an automatic test equipment interface to the design-for-testing subsystem.

In some examples, such an on-chip tester further includes a configuration register to control operation of the decoder, and an interconnect interface in communication with the configuration register and a system-on-chip interconnect of the integrated circuit to permit the configuration register to be programmed via the system-on-chip interconnect.

In some examples, such an on-chip tester additionally or alternatively includes a configuration register to control operation of the multiplexer, and an interconnect interface in communication with the configuration register and a system-on-chip interconnect of the integrated circuit to permit the configuration register to be programmed via the system-on-chip interconnect.

In some examples, such an on-chip tester additionally or alternatively includes a memory mapped register to control operation of the multiplexer.

In some examples, the decoder of such an on-chip tester is further to: (a) determine whether a type of first stored data corresponds to a control type or a data type, (b) when the type of the first stored data corresponds to the control type, (i) decode an identifier included in the first stored data and (ii) determine the test stimuli based on the identifier and payload data included in the first stored data, and (c) when the type of the first stored data corresponds to the data type, determine the test stimuli based on the first stored data and contents of second stored data decoded prior to decoding of the first stored data.

In some examples, the multiplexer of such an on-chip tester is a first multiplexer, and the on-chip tester further includes a second multiplexer to selectively couple the decoder to at least one of a first memory module or a second memory module storing the test data. In some such examples, the on-chip tester further includes an interconnect interface in communication with a system-on-chip interconnect of the integrated circuit and the first memory module to permit the stored test data to be downloaded to the first memory from an external device via the system-on-chip interconnect.

In some examples, the decoder of such an on-chip tester is to apply the test stimuli to the design-for-testing subsystem without connecting to automatic test equipment external to the integrated circuit.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An on-chip tester for an integrated circuit (IC), comprising:
   a decoder on the IC having a test data input and a test stimuli interface;
   a multiplexer on the IC having a first multiplexer interface coupled to the test stimuli interface, a second multiplexer interface coupled to an automatic test equipment external to the IC, a third multiplexer interface coupled to a design-for-testing subsystem interface and an interface selection input; and
   a memory having a memory interface coupled to the test data input.

2. An on-chip tester as defined in claim 1, in which the decoder further has a control input, and further including a configuration register having a register input and a register output, the register output being coupled to the control input.

3. An on-chip tester as defined in claim 2, further including an interconnect interface having an input interface coupled to a system-on-chip interconnect and an output interface coupled to the register input.

4. An on-chip tester as defined in claim 1, further including a configuration register having a register input and a register output, the register output being coupled to the interface selection input.

5. An on-chip tester as defined in claim 4, further including an interconnect interface having an input interface coupled to a system-on-chip interconnect and an output interface coupled to the register input.

6. An on-chip tester as defined in claim 4, in which the register input is coupled to a memory interface, and the configuration register is a memory mapped register.

7. An on-chip tester as defined in claim 1, comprising:
   a multiplex circuit having a first input interface, a second input interface, an output interface coupled to the test data input, and a second interface selection input;
   a non-volatile memory circuit coupled to the first input interface; and
   a volatile memory circuit coupled to the second input interface.

8. An on-chip tester as defined in claim 7, further including:
a configuration register having a register input and a register output, the register output being coupled to the second interface selection input; and
an interconnect interface having an input interface coupled to a system-on-chip interconnect and an output interface coupled to the register input.

9. An integrated circuit (IC) comprising:
a design-for-testing subsystem in communication with a plurality of logic modules, the design-for-testing subsystem to apply test stimuli to respective ones of the plurality of logic modules and receive corresponding test results from the respective ones of the plurality of logic modules;
an on-chip tester to determine a first test stimuli to apply to a first one of the logic modules; and
a multiplexer to selectively couple the design-for-testing subsystem to one of the on-chip tester or an automatic test equipment external to the IC.

10. An integrated circuit as defined in claim 9, in which the on-chip tester is to decode stored test data to determine the test stimuli, the stored test data including code words and data words.

11. An integrated circuit as defined in claim 9, further including a boot loader to:
determine whether a reset of a primary boot processor of the integrated circuit was initiated by the on-chip tester;
perform a first boot procedure when the reset of the primary boot processor was not initiated by the on-chip tester; and
perform a second boot procedure when the reset of the primary boot processor was initiated by the on-chip tester.

12. An integrated circuit as defined in claim 11, in which the primary boot processor implements a system-on-chip interconnect, and the on-chip tester is controlled via the system-on-chip interconnect.

13. An integrated circuit as defined in claim 12, in which the on-chip tester is to decode stored test data to determine the test stimuli, and the stored test data is downloaded to the on-chip tester via the system-on-chip interconnect.

14. An integrated circuit as defined in claim 9, in which the on-chip tester is arranged to apply the first test stimuli to the design-for-testing subsystem without connecting to the automatic test equipment external to the integrated circuit.

15. A method for on-chip field testing of an integrated circuit (IC), the method comprising:
configuring a multiplexer on the IC to connect one of an automatic test equipment external to the IC and an on-chip tester on the IC to a design-for-testing subsystem in communication with a plurality of logic modules of the IC;
connecting the on-chip tester to the design-for-testing system;
triggering operation of the on-chip tester to apply test stimuli to the design-for-testing subsystem via the multiplexer; and
comparing results of applying the test stimuli with reference results to test a first one of the logic modules of the integrated circuit.

16. A method as defined in claim 15, further including:
determining whether a reset of a primary boot processor of the integrated circuit was initiated by the on-chip tester;
performing a first boot procedure when the reset of the primary boot processor was not initiated by the on-chip tester; and
performing a second boot procedure when the reset of the primary boot processor was initiated by the on-chip tester.

17. A method as defined in claim 15, further including programming a configuration register of the on-chip tester via a system-on-chip interconnect to trigger operation of the on-chip tester.

18. A method as defined in claim 15, further including programming a configuration register of the on-chip tester to select a first one of a plurality of memory modules on the IC from which the on-chip tester is to access test data to be decoded to determine the test stimuli.

19. A method as defined in claim 18, further including downloading the test data to the first one of the plurality of memory modules via a system-on-chip interconnect.

20. A method as defined in claim 15, further including applying the test stimuli to the design-for-testing subsystem without connecting to automatic test equipment external to the integrated circuit.

* * * * *